United States Patent
Shimizu et al.

(10) Patent No.: US 11,764,269 B2
(45) Date of Patent: **\*Sep. 19, 2023**

(54) SEMICONDUCTOR DEVICE, SEMICONDUCTOR DEVICE MANUFACTURING METHOD, INVERTER CIRCUIT, DRIVER DEVICE, VEHICLE, AND ELEVATOR

(71) Applicant: KABUSHIKI KAISHA TOSHIBA, Tokyo (JP)

(72) Inventors: Tatsuo Shimizu, Shinagawa (JP); Yukio Nakabayashi, Yokohama (JP); Johji Nishio, Machida (JP); Chiharu Ota, Kawasaki (JP); Toshihide Ito, Shibuya (JP)

(73) Assignee: KABUSHIKI KAISHA TOSHIBA, Tokyo (JP)

( \* ) Notice: Subject to any disclaimer, the term of this patent is extended or adjusted under 35 U.S.C. 154(b) by 0 days.

This patent is subject to a terminal disclaimer.

(21) Appl. No.: 17/902,074

(22) Filed: Sep. 2, 2022

(65) Prior Publication Data

US 2022/0416030 A1   Dec. 29, 2022

Related U.S. Application Data

(62) Division of application No. 17/176,525, filed on Feb. 16, 2021, now Pat. No. 11,469,301.

(30) Foreign Application Priority Data

Jul. 1, 2020   (JP) .................................. 2020-114003

(51) Int. Cl.
| | | |
|---|---|---|
| *H01L 29/10* | (2006.01) | |
| *H01L 29/16* | (2006.01) | |
| *H01L 29/78* | (2006.01) | |
| *H01L 21/04* | (2006.01) | |
| *H01L 29/66* | (2006.01) | |
| *B66B 11/04* | (2006.01) | |

(Continued)

(52) U.S. Cl.
CPC ........ *H01L 29/1095* (2013.01); *H01L 21/046* (2013.01); *H01L 29/1608* (2013.01);
(Continued)

(58) Field of Classification Search
None
See application file for complete search history.

(56) References Cited

U.S. PATENT DOCUMENTS

| 9,978,842 B2 | 5/2018 | Ariyoshi et al. |
| 2013/0234161 A1 | 9/2013 | Shimizu et al. |

(Continued)

FOREIGN PATENT DOCUMENTS

| JP | 2013187302 A | 9/2013 |
| JP | 2014143248 A | 8/2014 |

(Continued)

*Primary Examiner* — Jack S Chen
(74) *Attorney, Agent, or Firm* — Maier & Maier, PLLC

(57) ABSTRACT

This semiconductor device according to an embodiment includes: a silicon carbide layer; a gate electrode; a silicon oxide layer between the silicon carbide layer and the gate electrode; and a region between the silicon carbide layer and the silicon oxide layer and having a nitrogen concentration not less than $1\times10^{21}$ cm$^{-3}$.
A nitrogen concentration distribution in the silicon carbide layer, the silicon oxide layer, and the region has its peak in the region, and a state density $Z_{1/2}$ in a portion is not more than $1\times10^{11}$ cm$^{-3}$. The portion is within 100 nm from the silicon oxide layer toward the silicon carbide layer. A nitrogen concentration and a carbon concentration in a position 1 nm from the peak toward the silicon oxide layer is not more than $1\times10^{18}$ cm$^{-3}$, and a nitrogen concentration in a position 1 nm from the peak toward the silicon carbide layer is not more than $1\times10^{18}$ cm$^{-3}$.

11 Claims, 22 Drawing Sheets

(51) Int. Cl.
*B61C 3/00* (2006.01)
*B61C 17/00* (2006.01)
*B60K 1/00* (2006.01)
*B60L 53/20* (2019.01)
*H02P 27/06* (2006.01)

(52) U.S. Cl.
CPC .... *H01L 29/66068* (2013.01); *H01L 29/7802* (2013.01); *B60K 1/00* (2013.01); *B60L 53/20* (2019.02); *B61C 3/00* (2013.01); *B61C 17/00* (2013.01); *B66B 11/043* (2013.01); *H02P 27/06* (2013.01)

(56) References Cited

U.S. PATENT DOCUMENTS

| | | | |
|---|---|---|---|
| 2016/0005605 A1 | 1/2016 | Nishio et al. | |
| 2016/0087044 A1 | 3/2016 | Daniel et al. | |
| 2016/0247907 A1 | 8/2016 | Ohashi et al. | |
| 2018/0083112 A1 | 3/2018 | Shimizu et al. | |
| 2020/0091297 A1 | 3/2020 | Shimizu | |
| 2021/0296446 A1 | 9/2021 | Shimizu et al. | |
| 2022/0045175 A1 | 2/2022 | Shimizu | |
| 2022/0302250 A1* | 9/2022 | Shimizu | H01L 29/167 |
| 2022/0416030 A1* | 12/2022 | Shimizu | H01L 29/7802 |

FOREIGN PATENT DOCUMENTS

| | | |
|---|---|---|
| JP | 2014222735 A | 11/2014 |
| JP | 2015060905 A | 3/2015 |
| JP | 2016018861 A | 2/2016 |
| JP | 2016063122 A | 4/2016 |
| JP | 2016157761 A | 9/2016 |
| JP | 2017199922 A | 11/2017 |
| JP | 2018046246 A | 3/2018 |
| JP | 2020047668 A | 3/2020 |

* cited by examiner

SEMICONDUCTOR DEVICE, SEMICONDUCTOR DEVICE MANUFACTURING METHOD, INVERTER CIRCUIT, DRIVER DEVICE, VEHICLE, AND ELEVATOR

CROSS-REFERENCE TO RELATED APPLICATION

This application is a divisional of U.S. application Ser. No. 17/176,525, filed Feb. 16, 2021, which is based upon and claims the benefit of priority from Japanese Patent Application No. 2020-114003, filed on Jul. 1, 2020, the entire contents of each of which are incorporated herein by reference.

FIELD

Embodiments described herein relate generally to a semiconductor device, a semiconductor device manufacturing method, an inverter circuit, a driver device, a vehicle, and an elevator.

BACKGROUND

Silicon carbide (SiC) is expected to be the material used for next-generation semiconductor devices. In comparison with silicon (Si), silicon carbide possesses superior physical properties in having three times the bandgap, approximately ten times the breakdown field strength, and roughly three times the thermal conductivity. If such properties are taken advantage of, a low-loss semiconductor device capable of operating at high temperatures can be realized.

When a metal oxide semiconductor field effect transistor (MOSFET) is formed using silicon carbide, for example, there is the problem that the carrier mobility drops and threshold voltage fluctuations arise.

DETAILED DESCRIPTION

Figure 1:
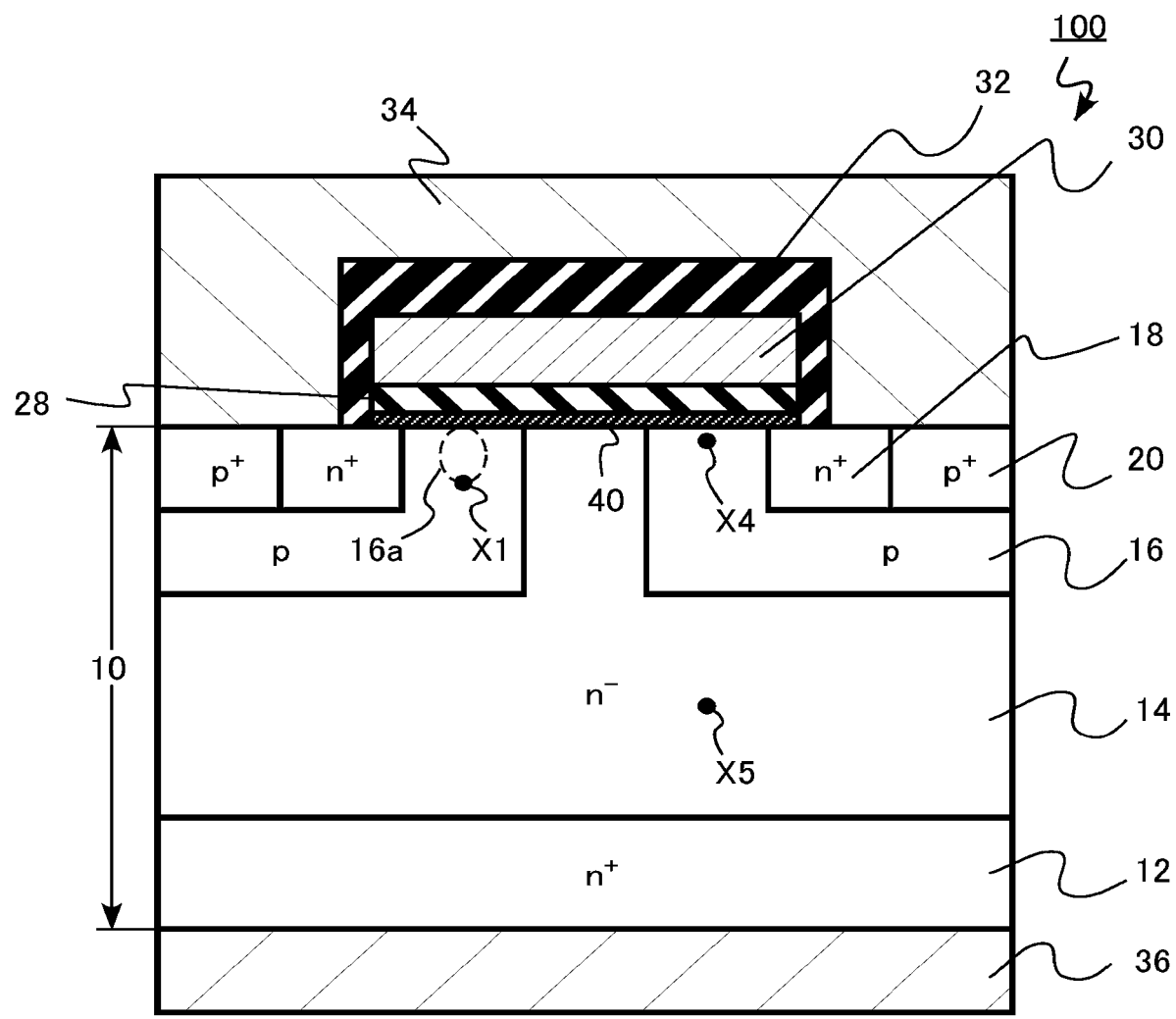
FIG. 1 is a schematic cross-sectional view of a semiconductor device according to a first embodiment.

A semiconductor device according to an embodiment includes: a silicon carbide layer; a gate electrode; a silicon oxide layer disposed between the silicon carbide layer and the gate electrode; and a region disposed between the silicon carbide layer and the silicon oxide layer and having a nitrogen concentration equal to or more than $1\times10^{21}$ cm$^{-3}$, wherein a nitrogen concentration distribution in the silicon carbide layer, the silicon oxide layer, and the region has its peak in the region, and a state density $Z_{1/2}$ measured using deep level transient spectroscopy (DLTS) in a portion is equal to or less than $1\times10^{11}$ cm$^{-3}$, the portion is disposed between the silicon oxide layer and a first position spaced apart by 100 nm from the silicon oxide layer toward the silicon carbide layer, a nitrogen concentration in a second position spaced apart by 1 nm from the peak toward the silicon oxide layer is equal to or less than $1\times10^{18}$ cm$^{-3}$, a carbon concentration in the second position is equal to or less than $1\times10^{18}$ cm$^{-3}$, and a nitrogen concentration in a third position spaced apart by 1 nm from the peak toward the silicon carbide layer is equal to or less than $1\times10^{18}$ cm$^{-3}$.

An embodiment of the present disclosure will be described hereinbelow with reference to the drawings. Note that, in the description hereinbelow, the same reference signs are assigned to the same or similar members, or the like, and a description is omitted, where appropriate, for members which are described once, or the like.

Further, in the following description, the notations n$^+$, n, and n$^-$, and p$^+$, p, and p$^-$ represent the relative levels of impurity concentration of each conductivity type. That is, n$^+$ indicates an n-type impurity concentration relatively higher than n, and n⁻ indicates an n-type impurity concentration relatively lower than n. Further, p⁺ indicates a p-type impurity concentration relatively higher than p, and p⁻ indicates a p-type impurity concentration relatively lower than p. Note that n⁺ and n⁻ are sometimes denoted simply as n types, and that p⁺ and p⁻ are sometimes denoted simply as p types. Unless otherwise stated, the impurity concentrations in each region are represented by values for the impurity concentration in the center of each region, for example.

The impurity concentration can be measured using secondary ion mass spectrometry (SIMS), for example. Furthermore, the relative level of the impurity concentration can also be determined from the level of the carrier concentration determined using scanning capacitance microscopy (SCM), for example. In addition, distances such as the width, depth, and the like, of an impurity region can be determined using SIMS, for example. Further, distances such as the width, depth, and the like, of an impurity region can be determined from an SCM image, for example.

The depth of the trench, the thickness of the insulating layer, and the like, can be measured using a SIMS profile, a transmission electron microscope (TEM) image, or a scanning electron microscope (SEM), for example.

The bonding states of silicon atoms, carbon atoms, nitrogen atoms, and oxygen atoms in the silicon carbide layer can be identified by using X-ray photoelectron spectroscopic analysis (XPS), for example. Furthermore, the concentrations of various bonding states and concentration magnitude relationships can be determined using X-ray photoelectron spectroscopic analysis (XPS), for example.

First Embodiment

A semiconductor device according to a first embodiment includes: a silicon carbide layer; a gate electrode; a silicon oxide layer disposed between the silicon carbide layer and the gate electrode; and a region disposed between the silicon carbide layer and the silicon oxide layer and having a nitrogen concentration equal to or more than $1 \times 10^{21}$ cm⁻³. A nitrogen concentration distribution in the silicon carbide layer, the silicon oxide layer, and the region has its peak in the region, and a state density $Z_{1/2}$ measured using deep level transient spectroscopy (DLTS) in a portion is equal to or less than $1 \times 10^{11}$ cm⁻³, the portion is disposed between the silicon oxide layer and a first position spaced apart by 100 nm from the silicon oxide layer toward the silicon carbide layer, a nitrogen concentration in a second position spaced apart by 1 nm from the peak toward the silicon oxide layer is equal to or less than $1 \times 10^{18}$ cm⁻³, a carbon concentration in the second position is equal to or less than $1 \times 10^{18}$ cm⁻³, and a nitrogen concentration in a third position spaced apart by 1 nm from the peak toward the silicon carbide layer is equal to or less than $1 \times 10^{18}$ cm⁻³.

FIG. 1 is a schematic cross-sectional view of a semiconductor device according to the first embodiment. The semiconductor device is a MOSFET 100. The MOSFET 100 is a double implantation MOSFET (DIMOSFET) in which a p-well and a source region are formed using ion implantation. Further, the MOSFET 100 is an n-channel MOSFET using electrons as carriers.

The MOSFET 100 is provided with a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 is provided with a drain region 12, a drift region 14 (first silicon carbide region), a p-well region 16 (second silicon carbide region), a source region 18, and a p-well contact region 20. The p-well region 16 has a channel portion 16a (portion).

The silicon carbide layer 10 is a 4H-SiC single crystal, for example. The silicon carbide layer 10 is disposed between the source electrode 34 and drain electrode 36.

Figure 2:
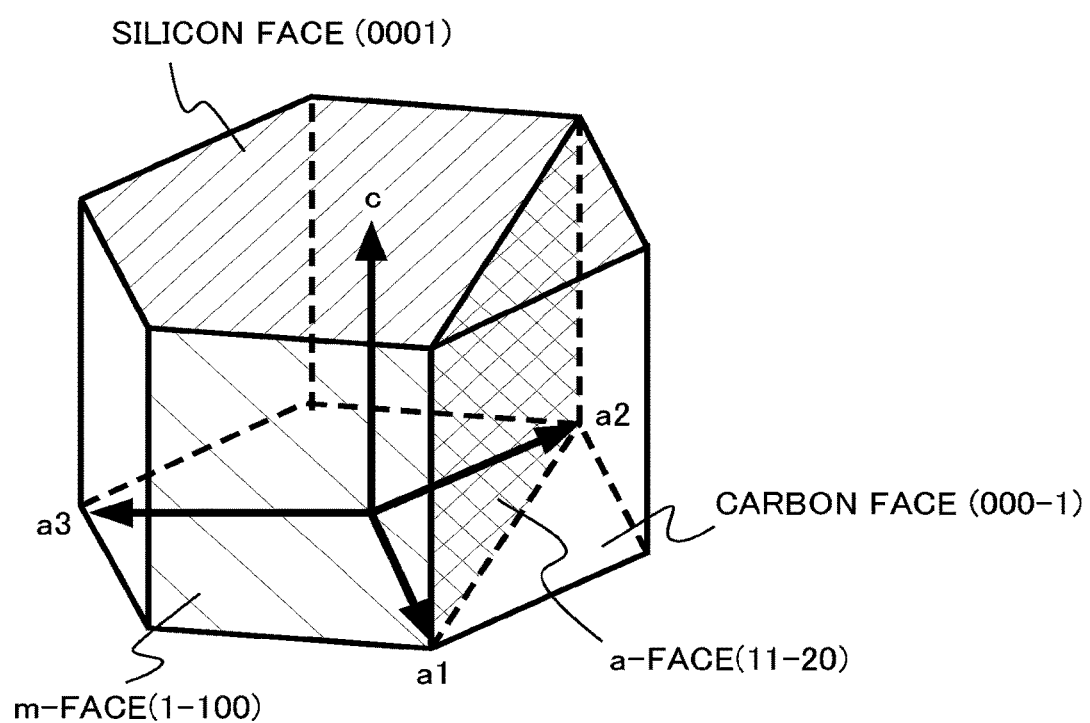
FIG. 2 is a diagram illustrating the crystal structure of a SiC semiconductor.

FIG. 2 is a diagram illustrating the crystal structure of an SiC semiconductor. The representative crystal structure of the SiC semiconductor is a hexagonal crystal system such as 4H-SiC. One of the faces the normal of which is the c axis along the axial direction of the hexagonal prism (the top face of a hexagonal prism) is face (0001). A face equivalent to face (0001) is called the silicon face (Si face) and appears as face {0001}. Silicon atoms (Si) are arranged on the outermost surface of the silicon face.

The other of the faces the normal of which is the c axis along the axial direction of the hexagonal prism (the top face of the hexagonal prism) is face (000-1). An equivalent face to face (000-1) is called the carbon face (C face) and appears as face {000-1}. Carbon atoms (C) are arranged on the outermost surface of the carbon face.

Meanwhile, a lateral face of the hexagonal prism (a prismatic face) is m-face, m-face being a face equivalent to face (1-100), that is, a face {1-100}. Furthermore, a face passing a pair of non-adjoining ridge lines is a-face, a-face being equivalent to a face (11-20), that is, a face {11-20}. Silicon atoms (Si) and carbon atoms (C) are both arranged on the outermost surface of m-face and a-face.

A case in which the surface of the silicon carbide layer 10 is a face inclined equal to or more than 0 degrees and equal to or less than 8 degrees with respect to the silicon face, and the back face thereof is a face inclined from equal to or more than 0 degrees and equal to or less than 8 degrees with respect to the carbon face is illustrated hereinbelow by way of example. The surface of the silicon carbide layer 10 is provided with an off angle of equal to or more than 0 degrees and equal to or less than 8 degrees with respect to the silicon face.

The drain region 12 is an n⁺-type SiC. The drain region 12 contains nitrogen (N) as the n-type impurity, for example. The n-type impurity concentration of the drain region 12 is equal to or more than $1 \times 10^{18}$ cm⁻³ and equal to or less than $1 \times 10^{21}$ cm⁻³, for example.

The drift region 14 is provided on the drain region 12. The drift region 14 is an n⁻-type SiC. The drift region 14 contains nitrogen as the n-type impurity, for example.

The n-type impurity concentration of the drift region 14 is lower than the n-type impurity concentration of the drain region 12. The n-type impurity concentration of the drift region 14 is equal to or more than $1 \times 10^{15}$ cm⁻³ and equal to or less than $2 \times 10^{16}$ cm⁻³, for example. The drift region 14 is a SiC epitaxial growth layer formed through epitaxial growth on the drain region 12, for example.

The thickness of the drift region 14 is equal to or more than 5 μm and equal to or less than 100 μm, for example.

The p-well region 16 is provided to a partial surface of the drift region 14. The p-well region 16 is disposed between the drift region 14 and the gate insulating layer 28. The p-well region 16 is a p-type SiC.

The p-well region 16 contains aluminum (Al) as a p-type impurity, for example. The p-type impurity concentration of the p-well region 16 is equal to or more than $1 \times 10^{16}$ cm⁻³ and equal to or less than $1 \times 10^{20}$ cm⁻³, for example.

The depth of the p-well region 16 is equal to or more than 0.4 μm and equal to or less than 0.8 μm, for example. The p-well region 16 functions as a channel region of the MOSFET 100.

A channel portion 16a is disposed between the gate insulating layer 28 and a first position (X1 in FIG. 1) spaced apart by 100 nm from the gate insulating layer 28 toward the silicon carbide layer 10. The channel portion 16a is disposed in the p-well region 16.

The state density $Z_{1/2}$ of the channel portion 16a is equal to or less than $1 \times 10^{11}$ cm$^{-3}$, the state density being measured using deep level transient spectroscopy (DLTS). The carbon vacancy density of the channel portion 16a is equal to or less than $1 \times 10^{11}$ cm$^{-3}$.

The Hall mobility of electrons in the channel portion 16a is equal to or more than 200 cm$^2$/V·s, for example. The Hall mobility is the mobility of electrons measured using Hall effect measurement.

The source region 18 is provided to a partial surface of the p-well region 16. The source region 18 is an n$^+$-type SiC. The source region 18 contains phosphorus (P) as an n-type impurity, for example. The n-type impurity concentration of the source region 18 is equal to or more than $1 \times 10^{18}$ cm$^{-3}$ and equal to or less than $1 \times 10^{22}$ cm$^{-3}$ cm, for example.

The depth of the source region 18 is shallower than the depth of the p-well region 16. The depth of the source region 18 is equal to or more than 0.2 μm and equal to or less than 0.4 μm, for example.

The p-well contact region 20 is provided to a partial surface of the p-well region 16. The p-well contact region 20 is provided to the side of the source region 18. The p-well contact region 20 is a p$^+$-type SiC.

The p-well contact region 20 contains aluminum as the p-type impurity, for example. The p-type impurity concentration of the p-well contact region 20 is equal to or more than $1 \times 10^{18}$ cm$^{-3}$ and equal to or less than $1 \times 10^{22}$ cm$^{-3}$, for example.

The depth of the p-well contact region 20 is shallower than the depth of the p-well region 16. The depth of the p-well contact region 20 is equal to or more than 0.2 μm and equal to or less than 0.4 μm, for example.

The gate insulating layer 28 is provided between the silicon carbide layer 10 and the gate electrode 30. The gate insulating layer 28 is provided between the drift region 14 and gate electrode 30, and the p-well region 16 and gate electrode 30. The gate insulating layer 28 is provided on drift region 14 and the p-well region 16. The gate insulating layer 28 is formed continuously on the surfaces of the drift region 14 and p-well region 16.

The gate insulating layer 28 contains silicon oxide. The gate insulating layer 28 is an example of a silicon oxide layer.

The thickness of the gate insulating layer 28 is equal to or more than 30 nm and equal to or less than 100 nm, for example. The gate insulating layer 28 functions as the gate insulating layer of the MOSFET 100.

The interface termination region 40 is disposed between the silicon carbide layer 10 and the gate insulating layer 28. The interface termination region 40 is disposed between the drift region 14 and gate insulating layer 28, and the p-well region 16 and gate insulating layer 28. The interface termination region 40 contains nitrogen (N) as the termination element terminating the dangling bonds of the silicon carbide layer 10. The interface termination region 40 is an example of a region.

The nitrogen concentration of the interface termination region 40 is equal to or more than $1 \times 10^{21}$ cm$^{-3}$.

Figure 3:
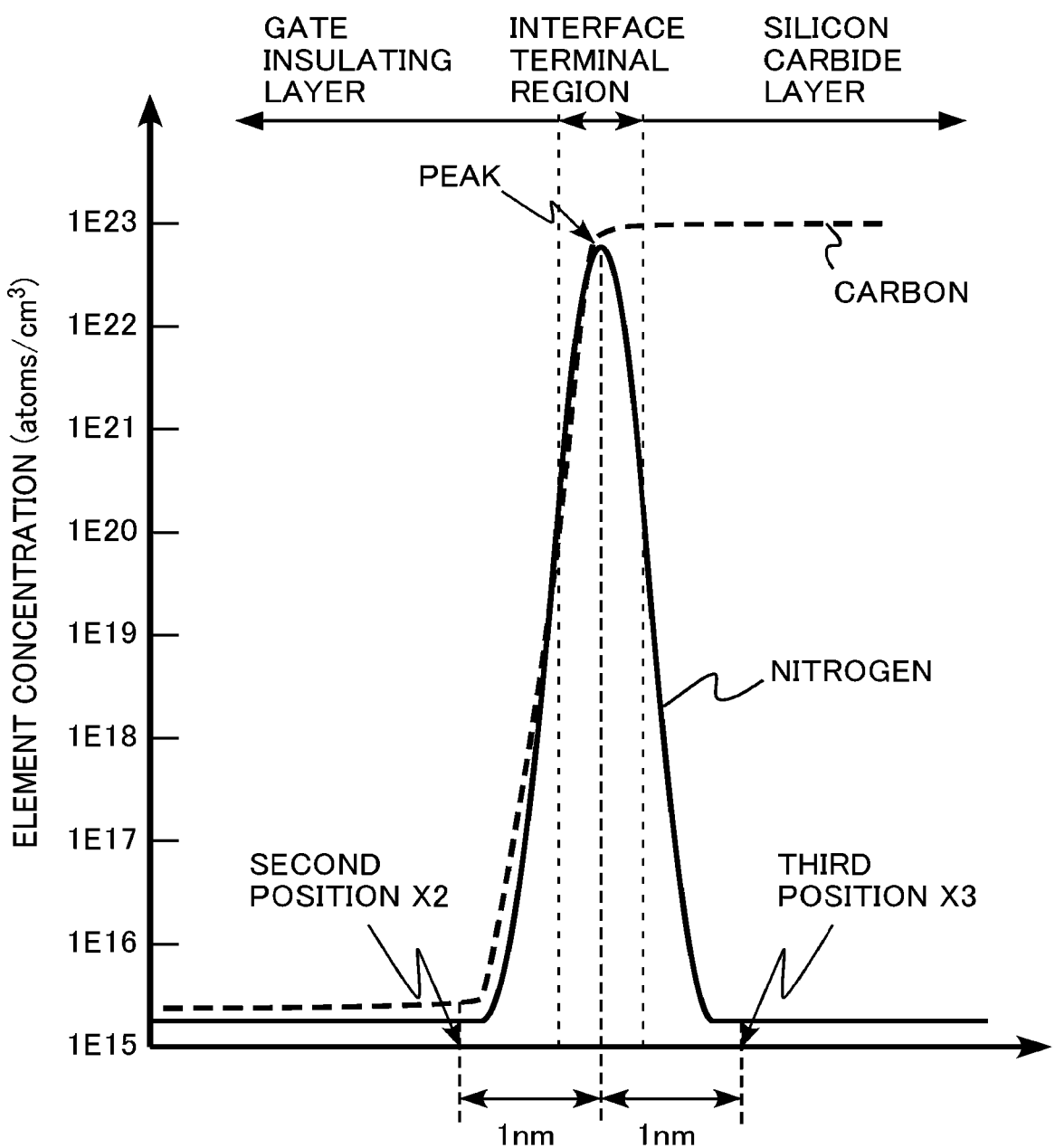
FIG. 3 is a diagram illustrating the element concentration distribution of the semiconductor device according to the first embodiment.

FIG. 3 is a diagram illustrating the element concentration distribution of the semiconductor device according to the first embodiment. FIG. 3 is a diagram illustrating the element concentration distribution in the gate insulating layer 28, interface termination region 40, and silicon carbide layer 10. FIG. 3 illustrates the concentration distributions of nitrogen and carbon.

The nitrogen concentration distribution has its peak in the interface termination region 40. The peak nitrogen concentration is equal to or more than $1 \times 10^{22}$ cm$^{-3}$, for example. The full-width at half-maximum with respect to the peak of the nitrogen concentration distribution is equal to or less than 1 nm, for example. Nitrogen is segregated at the interface between the silicon carbide layer 10 and the gate insulating layer 28.

The peak nitrogen concentration of the nitrogen concentration distribution is equal to or more than $1 \times 10^{21}$ cm$^{-3}$ and equal to or less than $4 \times 10^{23}$ cm$^{-3}$, for example.

The nitrogen concentration in a second position (X2 in FIG. 3) spaced apart by 1 nm from the peak of the nitrogen concentration distribution toward the gate insulating layer 28 is equal to or less than $1 \times 10^{18}$ cm$^{-3}$. Furthermore, the nitrogen concentration in a third position (X3 in FIG. 3) spaced apart by 1 nm from the peak of the nitrogen concentration distribution toward the silicon carbide layer 10 is equal to or less than $1 \times 10^{18}$ cm$^{-3}$.

Figure 4A:
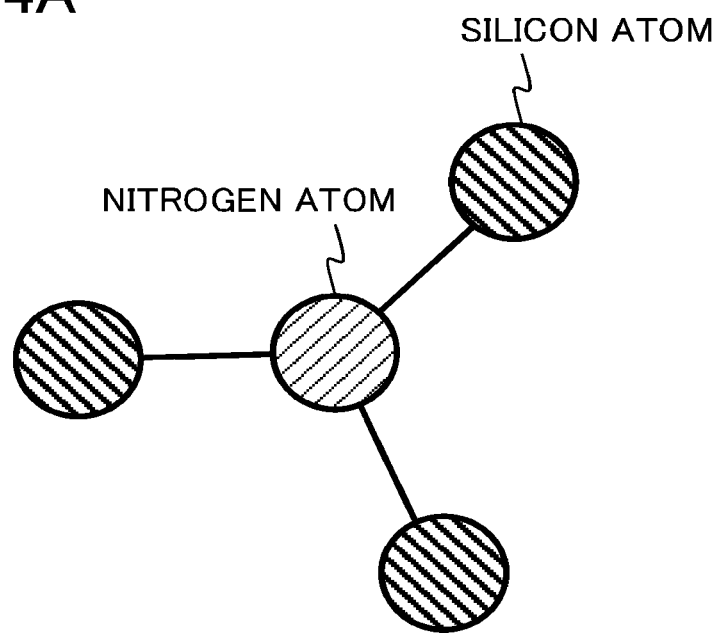
FIGS. 4A and 4B are schematic diagrams illustrating bonding states of a nitrogen atom in the semiconductor device according to the first embodiment.
Figure 4B:
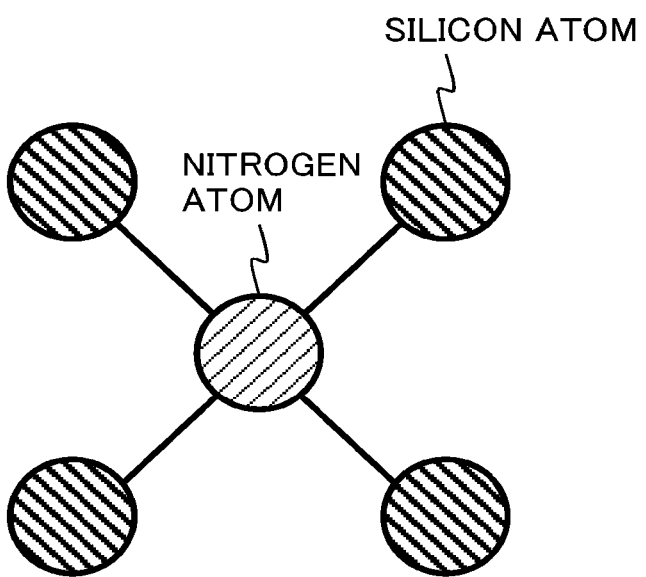

FIGS. 4A and 4B are schematic diagrams illustrating bonding states of a nitrogen atom in the semiconductor device according to the first embodiment. FIG. 4A illustrates a case where the nitrogen atom is a tricoordinate nitrogen atom, and FIG. 4B illustrates a case where the nitrogen atom is a tetracoordinate nitrogen atom.

In the case of a tricoordinate nitrogen atom illustrated in FIG. 4A, the nitrogen atom is bonded to three silicon atoms. In the case of a tetracoordinate nitrogen atom illustrated in FIG. 4B, the nitrogen atom is bonded to four silicon atoms.

In the interface termination region 40, the quantity of nitrogen atoms bonded to three silicon atoms is greater than the quantity of nitrogen atoms bonded to four silicon atoms. In other words, in the interface termination region 40, the quantity of tricoordinate nitrogen atoms is greater than the quantity of tetracoordinate nitrogen atoms.

For example, equal to or more than 90% of the nitrogen atoms present in the interface termination region 40 are tricoordinate nitrogen atoms. The concentration of tricoordinate nitrogen atoms is equal to or more than $1 \times 10^{21}$ cm$^{-3}$, for example.

The tricoordinate nitrogen atoms present in the interface termination region 40 terminate the dangling bonds of the surface of the silicon carbide layer 10.

The nitrogen atoms in the interface termination region 40 replace the carbon atoms in the uppermost layer of the silicon carbide layer 10. The nitrogen atoms in the interface termination region 40 come to be bonded to the silicon carbide layer 10 in a tri-coordinated manner. The nitrogen atoms are in the carbon atom positions in the crystal structure of the silicon carbide. The silicon atoms of the silicon carbide layer 10 are tri-coordinated with the nitrogen atoms.

The nitrogen atoms of the interface termination region 40 replace the carbon atoms of a bilayer constituting the uppermost layer of the silicon carbide layer 10. The termination element is finally bonded to the silicon carbide layer 10 in a tri-coordinated manner. Surplus silicon atoms and carbon atoms are emitted from the silicon carbide layer 10 toward the gate insulating layer 28. The nitrogen atoms are in the carbon atom positions in the crystal structure of the silicon carbide. Some of the silicon atoms of the outermost surface enter the gate insulating layer 28, and the nitrogen atoms are tri-coordinated with the silicon atoms of the silicon carbide layer 10.

The nitrogen atoms which are present in the bulk of the silicon carbide layer 10 and which replace the carbon sites in the crystal structure of the silicon carbide are tetracoordinate nitrogen atoms. The tetracoordinate nitrogen atoms function as an n-type dopant, and hence reduce the MOSFET threshold voltage.

The concentration of nitrogen atoms bonded to the four silicon atoms in the third position X3 is equal to or less than $1 \times 10^{18}$ cm$^{-3}$. In other words, the concentration of tetracoordinate nitrogen atoms in the third position X3 is equal to or less than $1 \times 10^{18}$ cm$^{-3}$.

The carbon concentration distribution decreases in moving from the interface termination region 40 toward the gate insulating layer 28. The carbon concentration in the second position X2 is equal to or less than $1 \times 10^{18}$ cm$^{-3}$.

The concentration in the second position X2 of composite defects of carbon defects and nitrogen defects, including the carbon atoms bonded to the oxygen atoms and the nitrogen atoms bonded to the oxygen atoms, is equal to or less than $1 \times 10^{18}$ cm$^{-3}$, for example.

The composite defects of carbon defects and nitrogen defects have a C—O—N bonding state. The carbon and nitrogen are formed due to silicon oxide of the gate insulating layer 28 entering silicon sites, and are adjacent to each other with one oxygen atom interposed therebetween.

The composite defects are formed when carbon and nitrogen are present in large quantities during formation of the silicon oxide. Isolated carbon defects are formed due to carbon entering the oxygen position in the silicon oxide. In addition, isolated nitrogen defects are formed due to nitrogen entering the oxygen position in the silicon oxide. Thus, isolated carbon defects and isolated nitrogen defects can be removed using oxidation.

However, composite defects are difficult to remove using oxidation and, when remaining in the silicon oxide, bring about degradation of the MOSFET characteristics. A manufacturing step in which excess carbon and excess nitrogen do not coexist in the silicon oxide is preferable in order to form a silicon oxide that has few composite defects.

The quantity of nitrogen atoms bonded to the four silicon atoms in a fourth position (X4 in FIG. 1) spaced apart by 5 nm from the gate insulating layer 28 toward the silicon carbide layer 10 is, for example, equal to or more than 80% and equal to or less than 120% of the quantity of nitrogen atoms bonded to the four silicon atoms in a fifth position (X5 in FIG. 1) spaced apart by 5 μm from the gate insulating layer 28 toward the silicon carbide layer 10. In other words, the quantity of tetracoordinate nitrogen atoms in the fourth position X4 is equal to or more than 80% and equal to or less than 120% of the quantity of tetracoordinate nitrogen atoms in the fifth position X5.

The nitrogen concentration in the fourth position X4 is equal to or less than $1 \times 10^{18}$ cm$^{-3}$, for example. The nitrogen concentration in the fifth position X5 is equal to or less than $1 \times 10^{18}$ cm$^{-3}$, for example. The nitrogen concentration in the fourth position X4 is equal to or more than 80% and equal to or less than 120% of the nitrogen concentration in the fifth position X5, for example.

The fourth position X4 is disposed in the p-well region 16, for example. The fifth position X5 is disposed in the drift region 14, for example.

The gate electrode 30 is provided on the gate insulating layer 28. The gate electrode 30 interposes the gate insulating layer 28 between itself and the silicon carbide layer 10. The gate electrode 30 interposes the gate insulating layer 28 between itself and the drift region 14. The gate electrode 30 interposes the gate insulating layer 28 between itself and the p-well region 16.

The gate electrode 30 is polycrystalline silicon containing an n-type impurity or a p-type impurity, for example.

The interlayer insulating film 32 is formed on the gate electrode 30. The interlayer insulating film 32 is disposed between the gate electrode 30 and the source electrode 34. The interlayer insulating film 32 is a silicon oxide film, for example.

The source electrode 34 is electrically connected to the source region 18 and the p-well contact region 20. The source electrode 34 also functions as a p-well electrode that supplies an electric potential to the p-well region 16. The source electrode 34 is in contact with the source region 18 and the p-well contact region 20, for example.

The source electrode 34 has a stacked structure of a nickel (Ni) barrier metal layer and an aluminum metal layer on the barrier metal layer, for example. The nickel barrier metal layer and silicon carbide layer may also react to form nickel silicide (NiSi, Ni$_2$Si, or the like). The nickel barrier metal layer and aluminum metal layer may also react to form an alloy.

The drain electrode 36 is provided on the side of the silicon carbide layer 10 opposite to the source electrode 34, that is, on the back-face side. The drain electrode 36 is electrically connected to the drain region 12. The drain electrode 36 contacts the drain region 12, for example.

The drain electrode 36 is nickel, for example. Nickel may react with the drain region 12 to form nickel silicide (NiSi, Ni$_2$Si, or the like).

Note that, according to the first embodiment, the n-type impurity is nitrogen or phosphorus, for example. Arsenic (As) or antimony (Sb) can also be adopted as the n-type impurity.

In addition, according to the first embodiment, the p-type impurity is aluminum, for example. Boron (B), gallium (Ga), and indium (In) can also be adopted as the p-type impurity.

An example of a semiconductor device manufacturing method according to the first embodiment will be described next.

The semiconductor device manufacturing method according to the first embodiment performs first ion implantation in which aluminum (Al) is implanted in the silicon carbide layer in a first projected range and using a first dose amount, performs second ion implantation in which carbon (C) is implanted in the silicon carbide layer in a second projected range and using a second dose amount equal to or more than ten times the first dose amount, performs a first heat treatment at equal to or more than 1600° C., forms a silicon oxide film on the silicon carbide layer, and forms a gate electrode on the silicon oxide film. Furthermore, the semiconductor device manufacturing method according to the first embodiment performs a second heat treatment in a nitrogen-containing atmosphere after forming the silicon oxide film. Further, the atmosphere is at least one atmosphere selected from a group consisting of a first atmosphere containing ammonia gas, a second atmosphere containing nitrogen gas and hydrogen gas, and a third atmosphere containing nitrogen gas and carbon dioxide gas.

A case where the second heat treatment is performed in the first atmosphere containing ammonia gas (NH$_3$) will be described by way of example hereinbelow.

Figure 5:
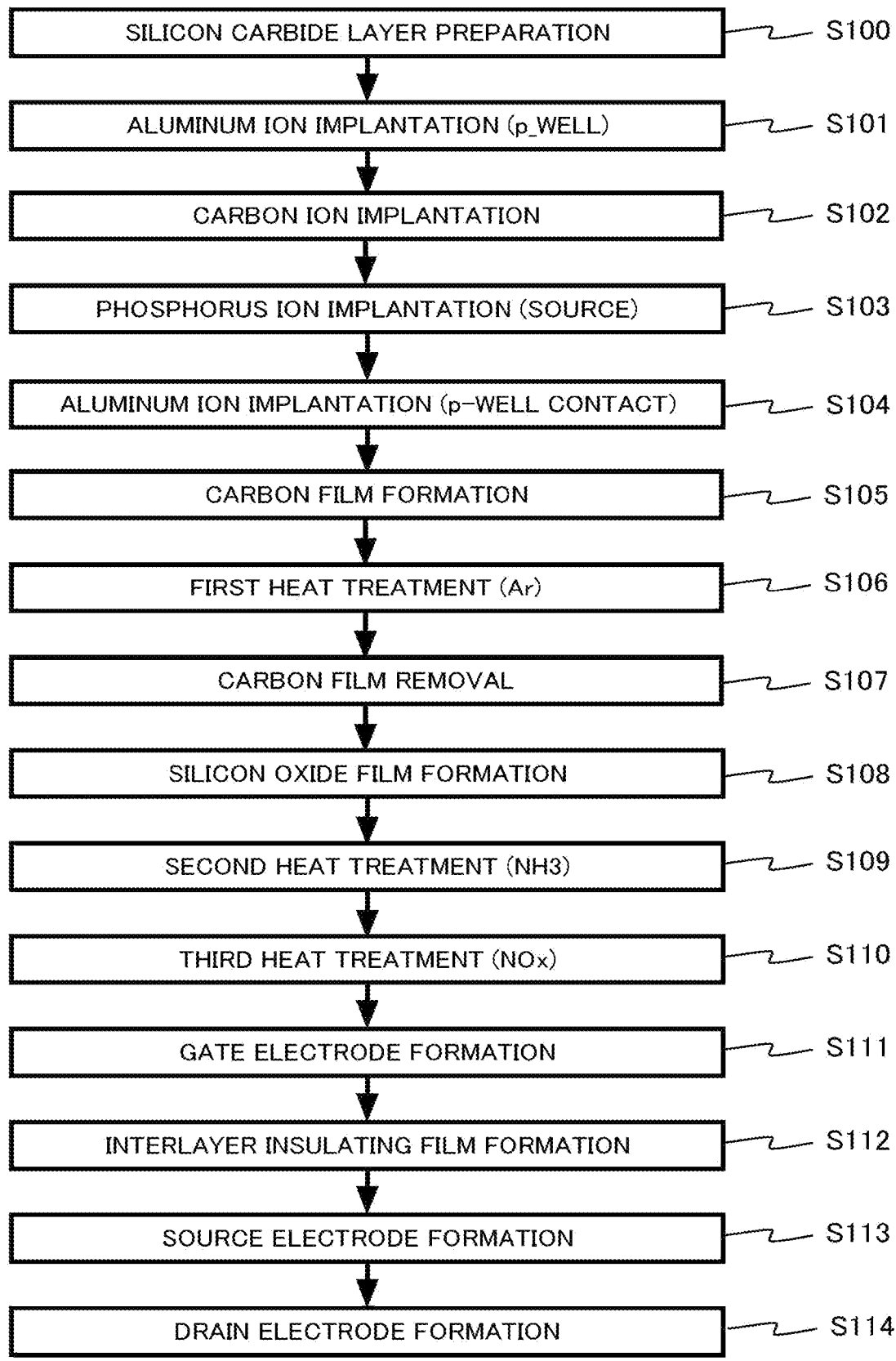
FIG. 5 is a process flow diagram of a semiconductor device manufacturing method according to the first embodiment.

FIG. 5 is a process flow diagram of a semiconductor device manufacturing method according to the first embodiment. FIGS. 6, 7, 8, 9, 10, 11, 12, 13, 14, 15, 16, and 17 are explanatory views and diagram of the semiconductor device manufacturing method according to the first embodiment. FIGS. 6, 7, 8, 10, 11, 12, 13, 14, 15, 16, and 17 are cross-sectional views during the course of manufacturing. FIG. 9 is a diagram illustrating element distribution after ion implantation.

As illustrated in FIG. 5, the semiconductor device manufacturing method according to the first embodiment includes silicon carbide layer preparation (step S100), aluminum ion implantation (step S101), carbon ion implantation (step S102), phosphorus ion implantation (step S103), aluminum ion implantation (step S104), carbon film formation (step S105), a first heat treatment (step S106), carbon film removal (step S107), silicon oxide film formation (step S108), a second heat treatment (step S109), a third heat treatment (step S110), gate electrode formation (step S111), interlayer insulating film formation (step S112), source electrode formation (step S113), and drain electrode formation (step S114).

Figure 6:
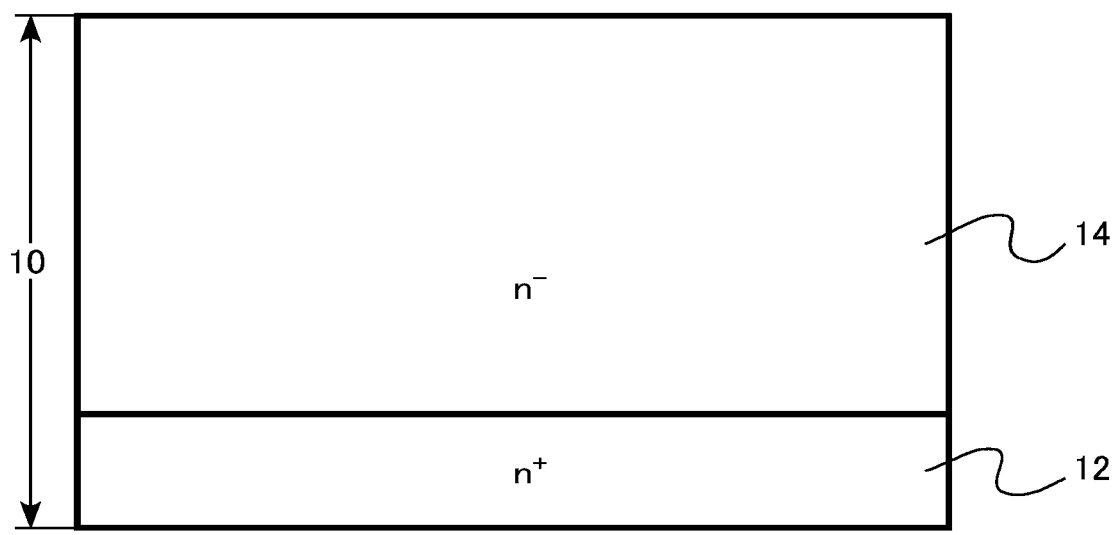
FIG. 6 is an explanatory view of the semiconductor device manufacturing method according to the first embodiment.

In step S100, the silicon carbide layer 10 is prepared (FIG. 6). The silicon carbide layer 10 is provided with an n$^+$-type drain region 12 and an n$^-$-type drift region 14. The drift region 14 is formed through epitaxial growth on the drain region 12, for example.

The drain region 12 contains nitrogen as the n-type impurity. The n-type impurity concentration of the drain region 12 is equal to or more than $1\times10^{18}$ cm$^{-3}$ and equal to or less than $1\times10^{21}$ cm$^{-3}$, for example.

The drift region 14 contains nitrogen as the n-type impurity. The n-type impurity concentration of the drift region 14 is equal to or more than $1\times10^{15}$ cm$^{-3}$ and equal to or less than $2\times10^{16}$ cm$^{-3}$, for example. The thickness of the drift region 14 is equal to or more than 5 µm and equal to or less than 100 µm, for example.

Figure 7:
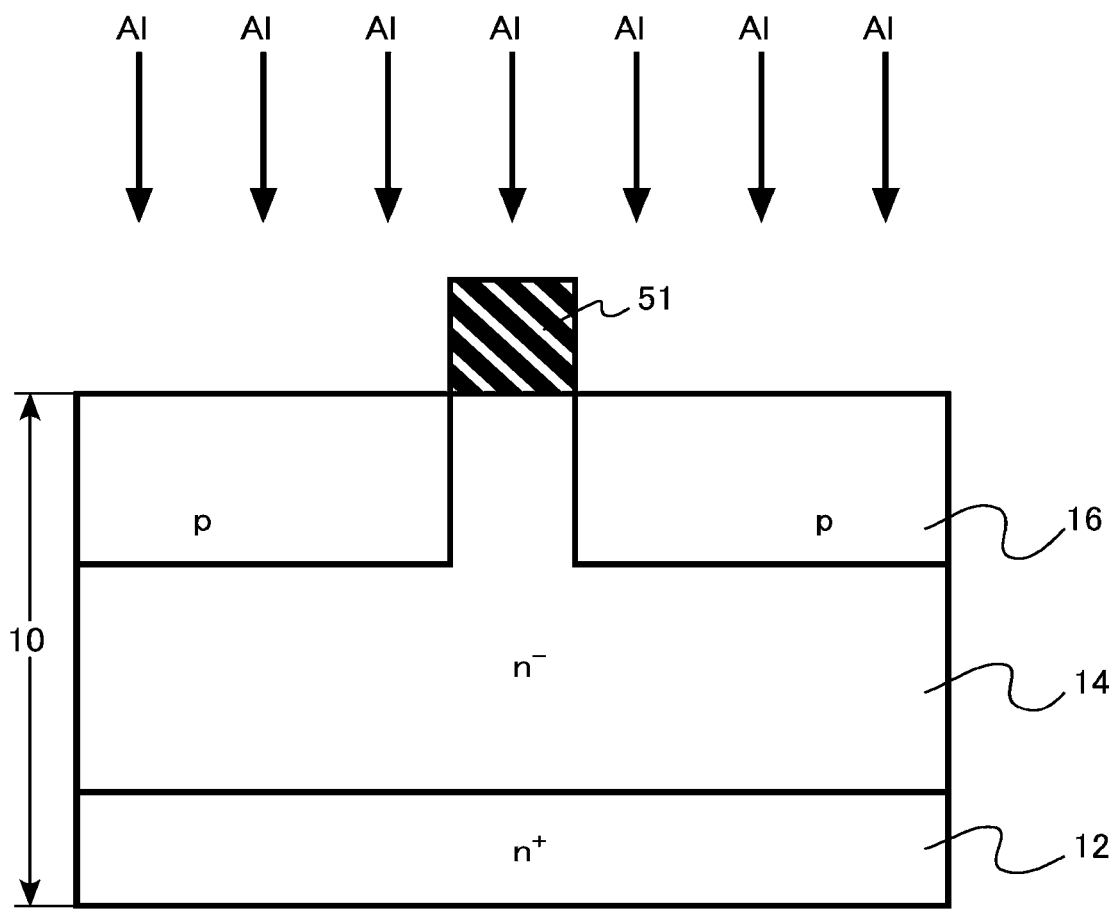
FIG. 7 is an explanatory view of the semiconductor device manufacturing method according to the first embodiment.

In step S101, a first mask material 51 is formed through the formation of an insulating film and the patterning of the insulating film through photolithography and etching, for example. Further, by using the first mask material 51 as an ion implantation mask, aluminum is ion-implanted in the drift region 14. The p-well region 16 is formed through ion implantation (FIG. 7).

Ion implantation to form the p-well region 16 is an example of the first ion implantation. Aluminum ion implantation is performed with the first projected range and the first dose amount. The projected range is the average projection range.

The first projected range is equal to or more than 0.1 µm and equal to or less than 0.6 µm, for example. The first dose amount is equal to or more than $1\times10^{12}$ cm$^{-2}$ and equal to or less than $1\times10^{14}$ cm$^{-2}$, for example.

Figure 8:
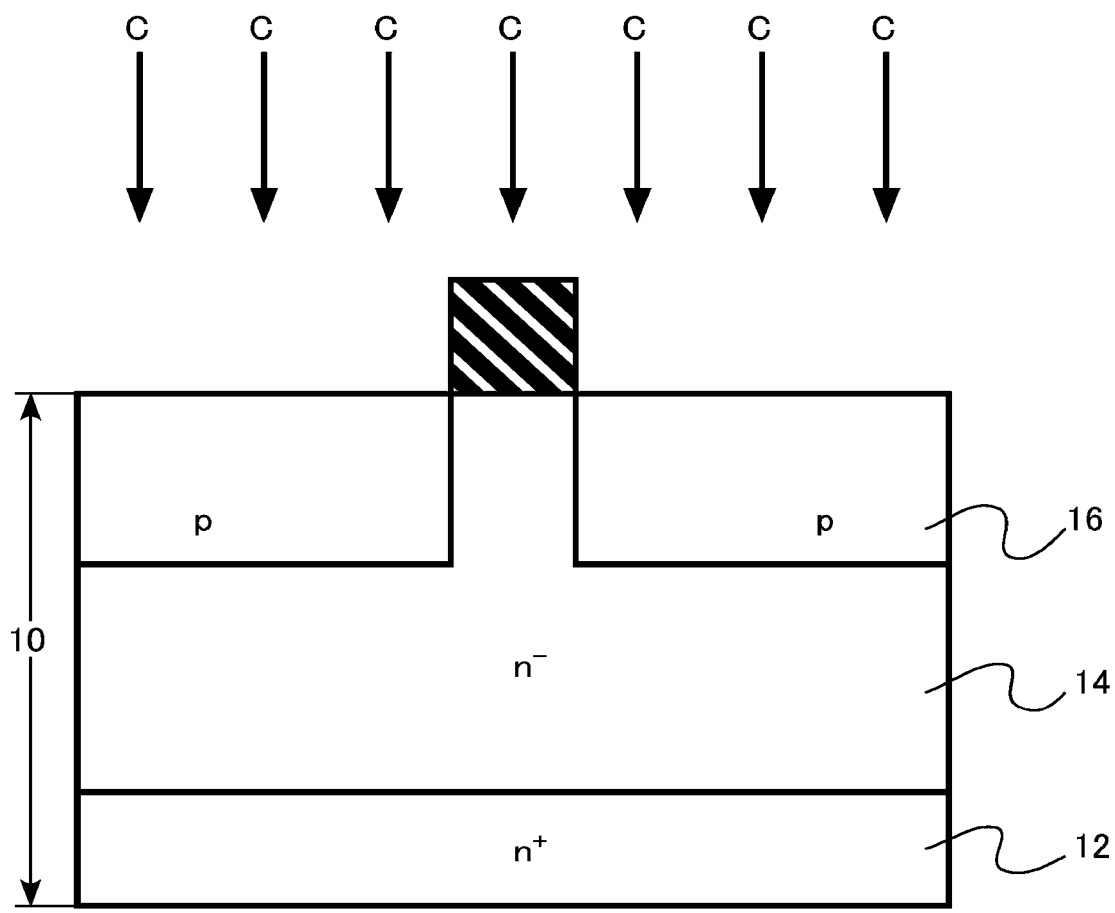
FIG. 8 is an explanatory view of the semiconductor device manufacturing method according to the first embodiment.
Figure 9:
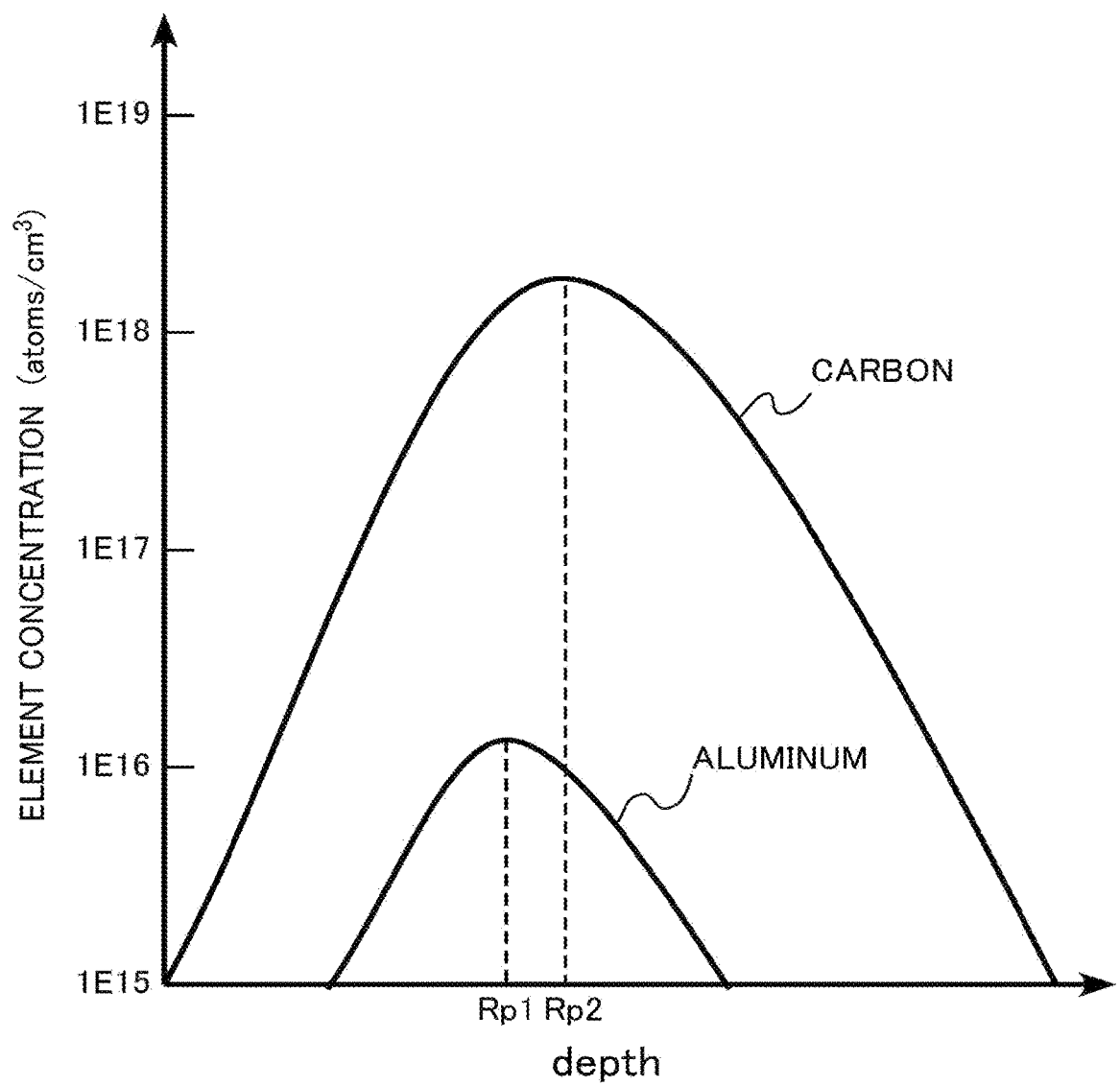
FIG. 9 is an explanatory diagram of the semiconductor device manufacturing method according to the first embodiment.

In step S102, the first mask material 51 is used as an ion implantation mask, and carbon is ion-implanted in the p-well region 16 (FIG. 8). The ion implantation of carbon in the p-well region 16 is an example of the second ion implantation. Carbon ion implantation is performed with the second projected range and the second dose amount. Thereafter, the first mask material 51 is removed.

The second projected range is equal to or more than 0.1 µm and equal to or less than 0.6 µm, for example. The second projected range is equal to or more than 80% and equal to or less than 120% of the first projected range, for example. The second dose amount is equal to or more than ten times the first dose amount. The second dose amount is equal to or less than one thousand times the first dose amount, for example. The second dose amount is equal to or more than $1\times10^{15}$ cm$^{-2}$ and equal to or less than $1\times10^{18}$ cm$^{-2}$, for example.

FIG. 9 illustrates a concentration distribution of aluminum implanted in the silicon carbide layer 10 using the first ion implantation, and a concentration distribution of carbon implanted in the silicon carbide layer 10 using the second ion implantation. FIG. 9 illustrates element distribution after ion implantation.

As illustrated in FIG. 9, a second projected range Rp2 for carbon ion implantation is disposed close to a first projected range Rp1 for aluminum ion implantation. Further, the second dose amount for carbon ion implantation is equal to or more than ten times the first dose amount for aluminum ion implantation, and therefore the carbon concentration distribution after ion implantation completely covers the aluminum concentration distribution after ion implantation, for example.

The peak concentration of the aluminum distribution is equal to or more than $1\times10^{16}$ cm$^{-3}$ and equal to or less than $1\times10^{20}$ cm$^{-3}$, for example. The peak concentration of the carbon distribution is equal to or more than $1\times10^{18}$ cm$^{-3}$ and equal to or less than $1\times10^{22}$ cm$^{-3}$, for example.

Figure 10:
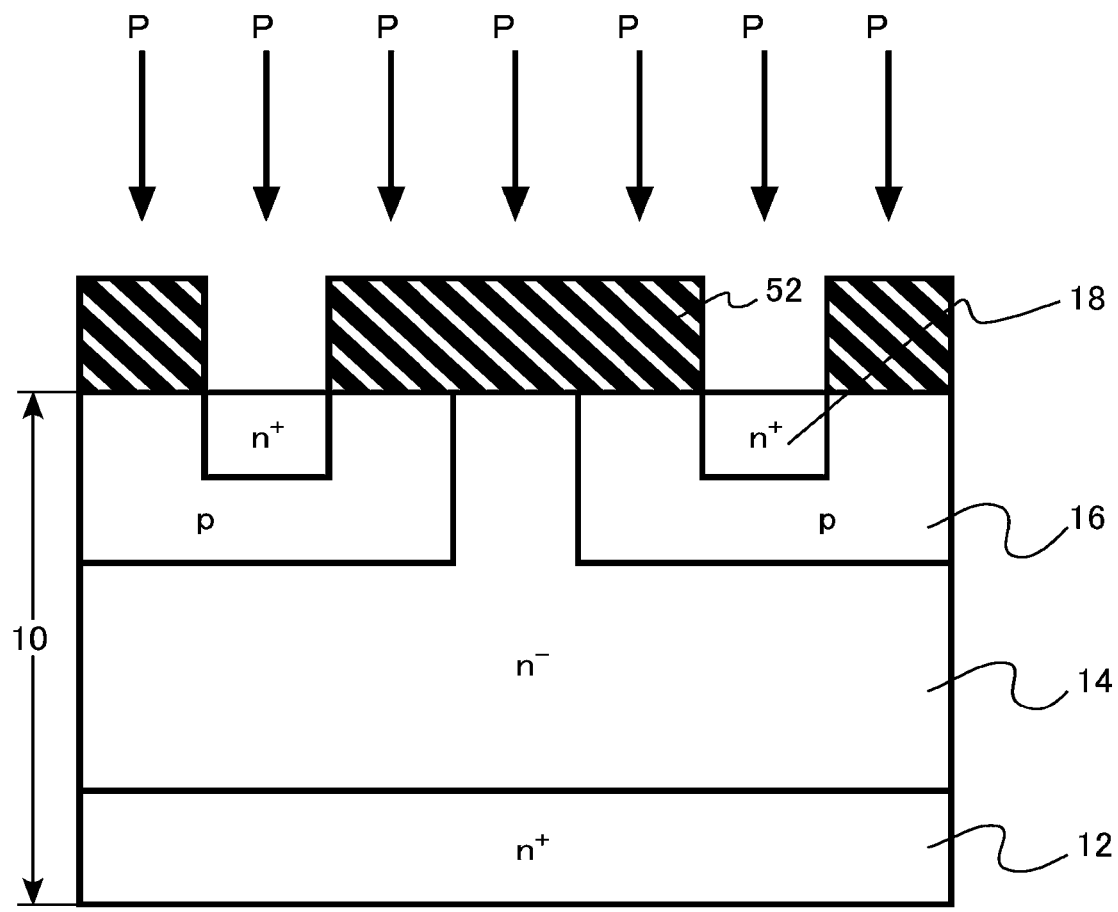
FIG. 10 is an explanatory view of the semiconductor device manufacturing method according to the first embodiment.

In step S103, a second mask material 52 is formed through the formation of an insulating film and the patterning of the insulating film through photolithography and etching, for example. Further, by using the second mask material 52 as an ion implantation mask, phosphorus is ion-implanted in the drift region 14, and the source region 18 is formed (FIG. 10). Thereafter, the second mask material 52 is removed.

Figure 11:
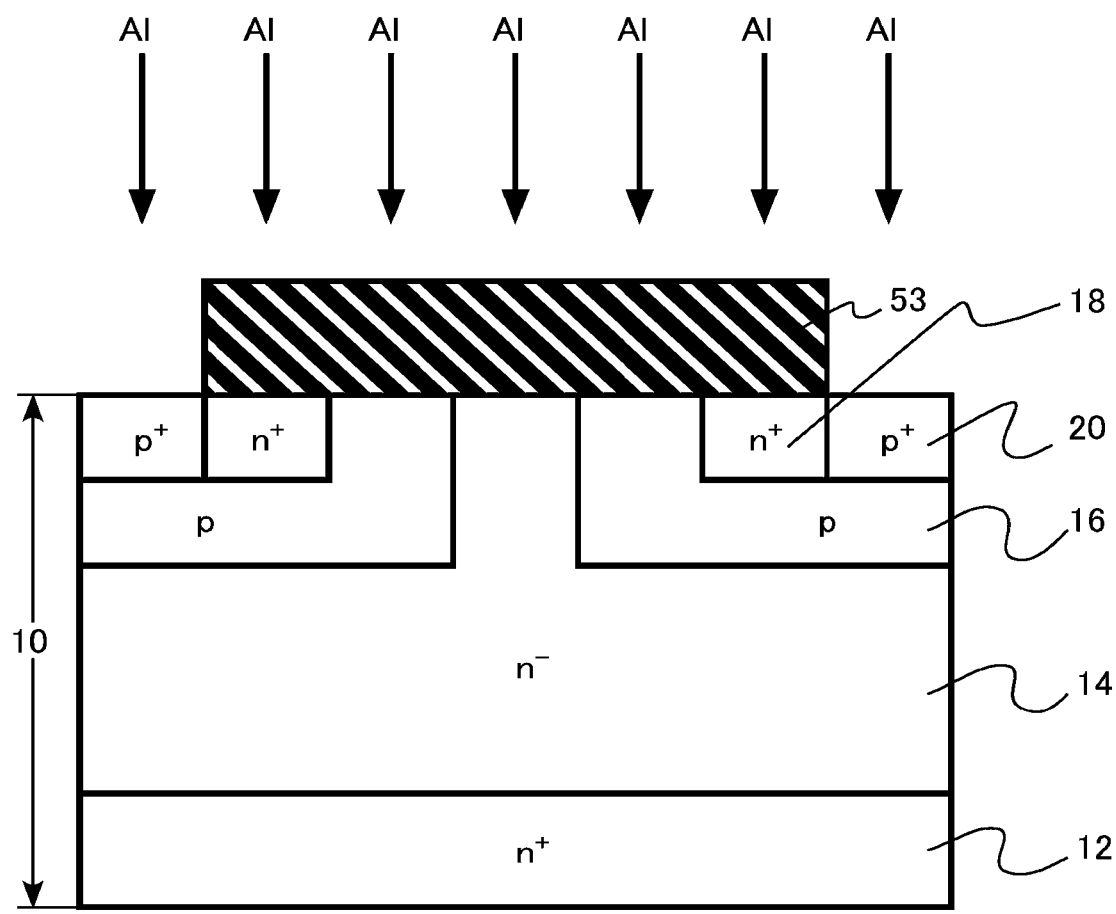
FIG. 11 is an explanatory view of the semiconductor device manufacturing method according to the first embodiment.

In step S104, a third mask material 53 is formed through the formation of an insulating film and the patterning of the insulating film through photolithography and etching, for example. Further, by using the third mask material 53 as an ion implantation mask, aluminum is ion-implanted in the drift region 14, and the p-well contact region 20 is formed (FIG. 11).

Figure 12:
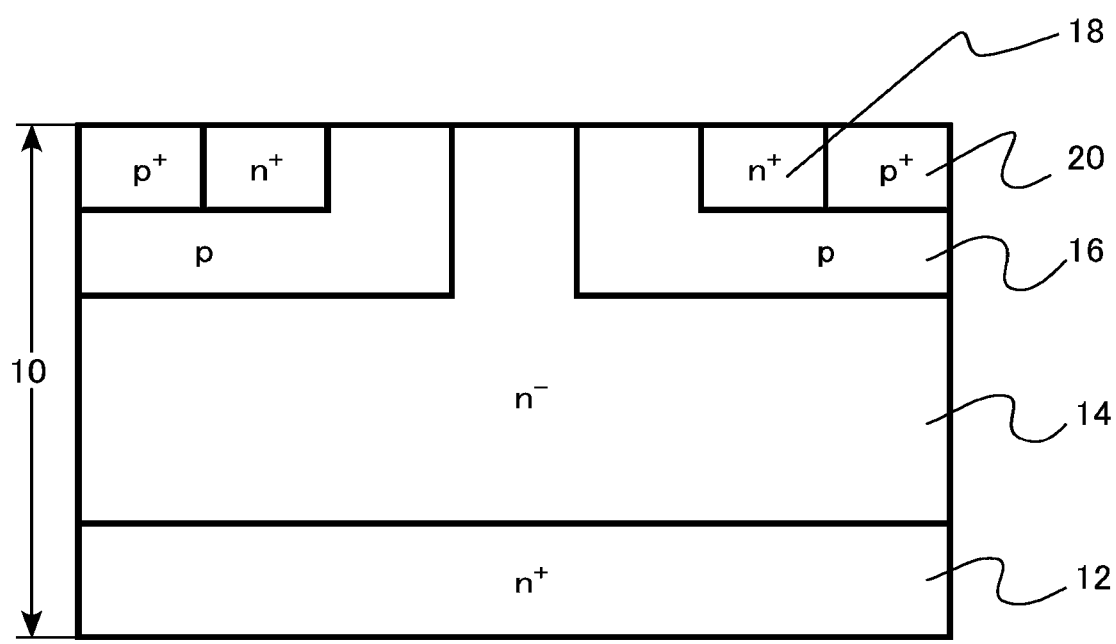
FIG. 12 is an explanatory view of the semiconductor device manufacturing method according to the first embodiment.

Thereafter, the third mask material 53 is removed (FIG. 12).

Figure 13:
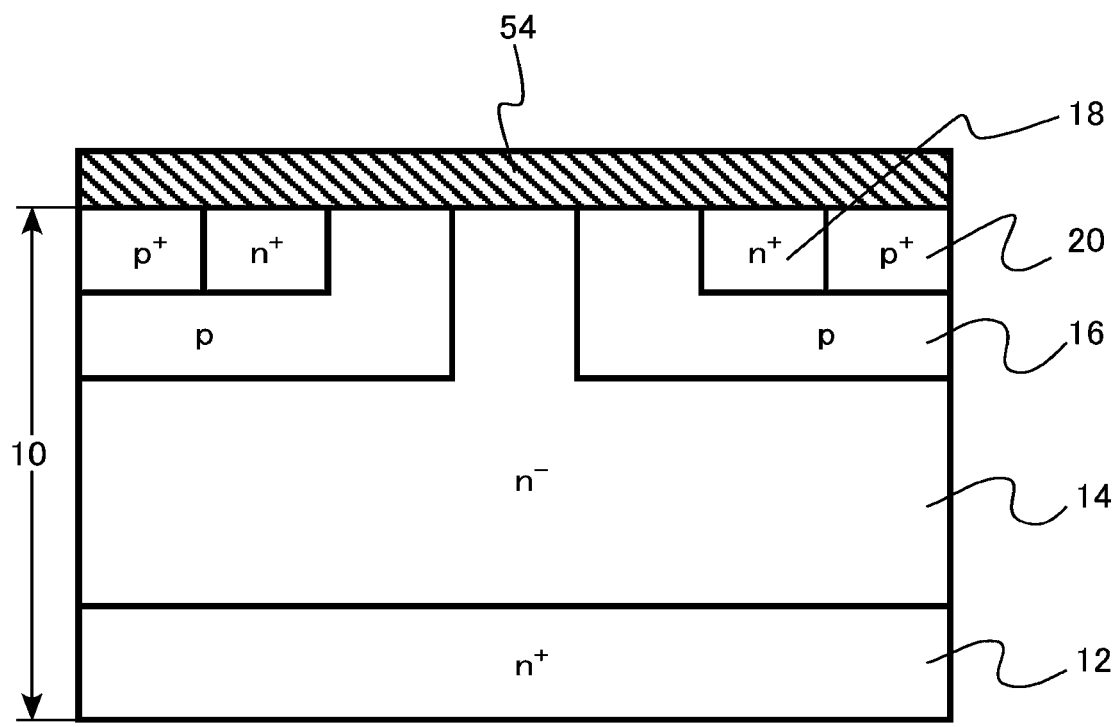
FIG. 13 is an explanatory view of the semiconductor device manufacturing method according to the first embodiment.

In step S105, a carbon film 54 is formed on the silicon carbide layer 10 (FIG. 13).

In step S106, the first heat treatment is performed. The first heat treatment is performed at equal to or more than 1600° C. The first heat treatment is performed in a non-oxidizing atmosphere. The first heat treatment is performed in an inert gas atmosphere, for example. The first heat treatment is performed in an argon gas atmosphere, for example.

The aluminum and phosphorus, which have been ion-implanted in the silicon carbide layer 10, are activated through the first heat treatment. The first heat treatment is activation annealing of aluminum and phosphorus. Further, due to the first heat treatment, the interstitial carbon formed through the carbon ion implantation in the silicon carbide layer 10 fills the carbon vacancy in the silicon carbide layer 10.

The carbon film 54 suppresses the desorption, in the atmosphere, of silicon and carbon from the silicon carbide layer 10 during the first heat treatment. In addition, the carbon film 54 absorbs surplus interstitial carbon in the silicon carbide layer 10 during the first heat treatment.

The first heat treatment is configured using a first step at equal to or more than 1600° C. and a second step at a lower temperature than the first step, for example. The second step is at equal to or less than 1000° C., for example.

For example, in the first step, the aluminum and phosphorus, which have been ion-implanted in the silicon carbide layer 10, are activated, and the interstitial carbon fills the carbon vacancy. For example, in the low-temperature second step, the surplus interstitial carbon is driven out from the silicon carbide layer 10 and absorbed by the carbon film 54.

Figure 14:
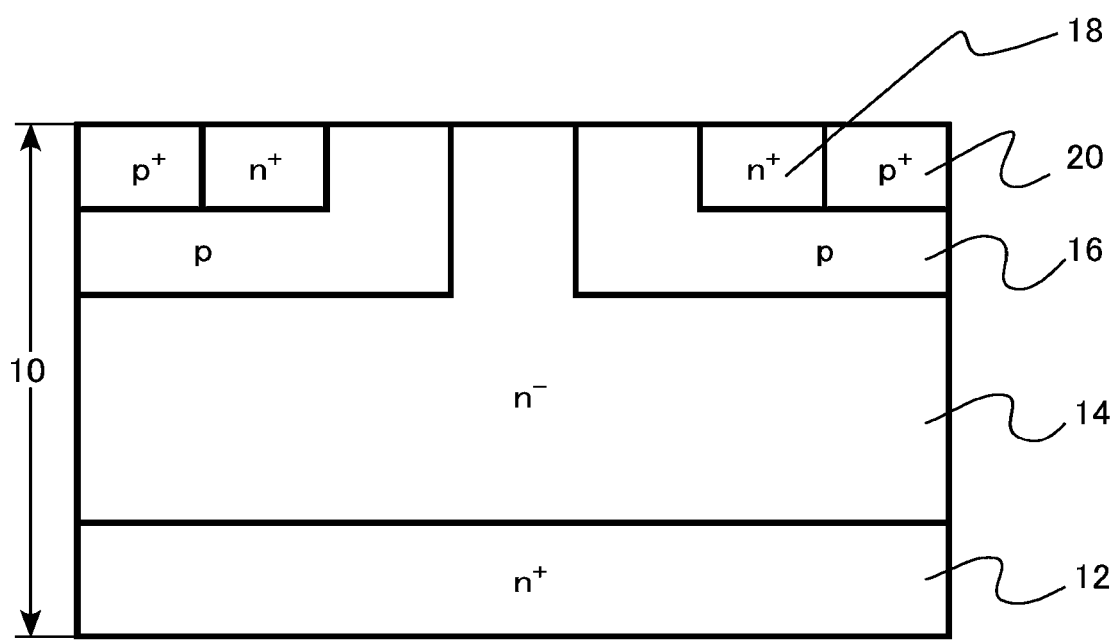
FIG. 14 is an explanatory view of the semiconductor device manufacturing method according to the first embodiment.

In step S107, the carbon film 54 is removed (FIG. 14).

Figure 15:
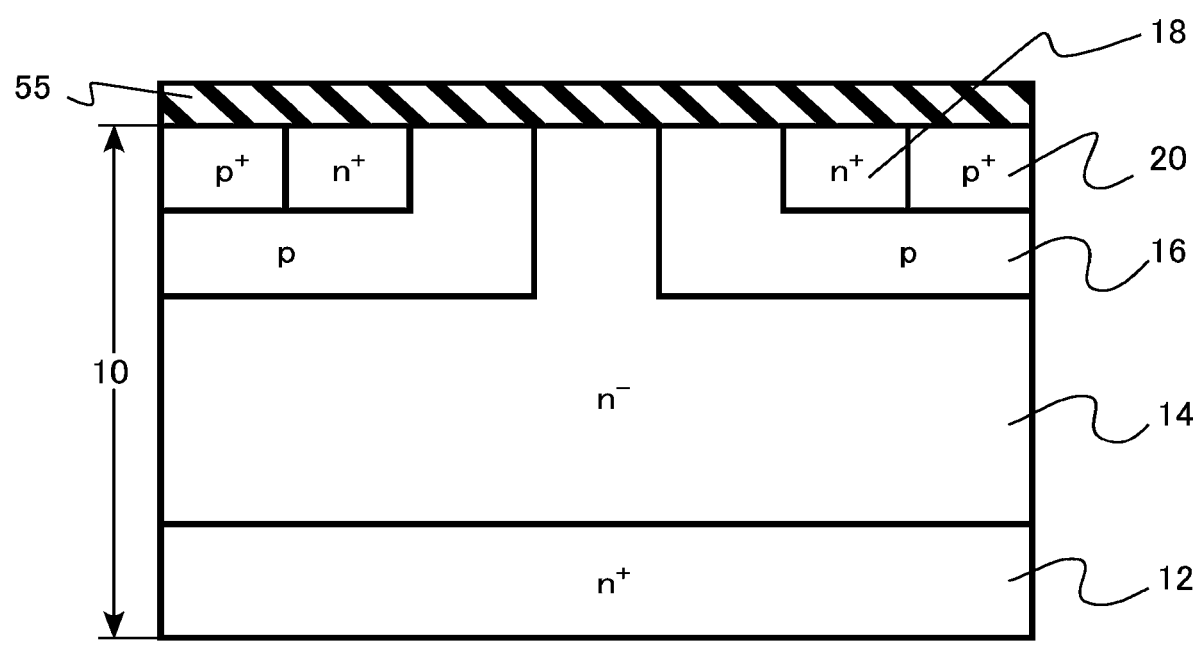
FIG. 15 is an explanatory view of the semiconductor device manufacturing method according to the first embodiment.

In step S108, a silicon oxide film 55 is formed on the silicon carbide layer 10 (FIG. 15). The silicon oxide film 55 ultimately becomes the gate insulating layer 28.

The silicon oxide film 55 is formed using vapor phase growth method, for example. The silicon oxide film 55 is formed through chemical vapor deposition (CVD) or physical vapor deposition (PVD), for example. The silicon oxide film 55 is a deposited film. The thickness of the silicon oxide film 55 is equal to or more than 30 nm and equal to or less than 100 nm, for example.

The silicon oxide film 55 is a silicon oxide film formed through CVD by using tetraalkyl ortho-silicate (TEOS) as the source gas, for example. Furthermore, the silicon oxide film 55 is a silicon oxide film formed through CVD by using dichlorosilane gas ($SiH_2Cl_2$) and nitrous oxide gas ($N_2O$) as the source gas, for example.

In step S109, the second heat treatment is performed. The second heat treatment is performed in an atmosphere containing ammonia gas ($NH_3$).

For example, the heat treatment is performed by supplying ammonia gas ($NH_3$) to a reactor into which the silicon carbide layer 10 has been placed.

The temperature of the second heat treatment is equal to or more than 1200° C. and equal to or less than 1600° C., for example.

The partial pressure of the ammonia gas in the atmosphere of the second heat treatment is equal to or more than 90%, for example.

Figure 16:
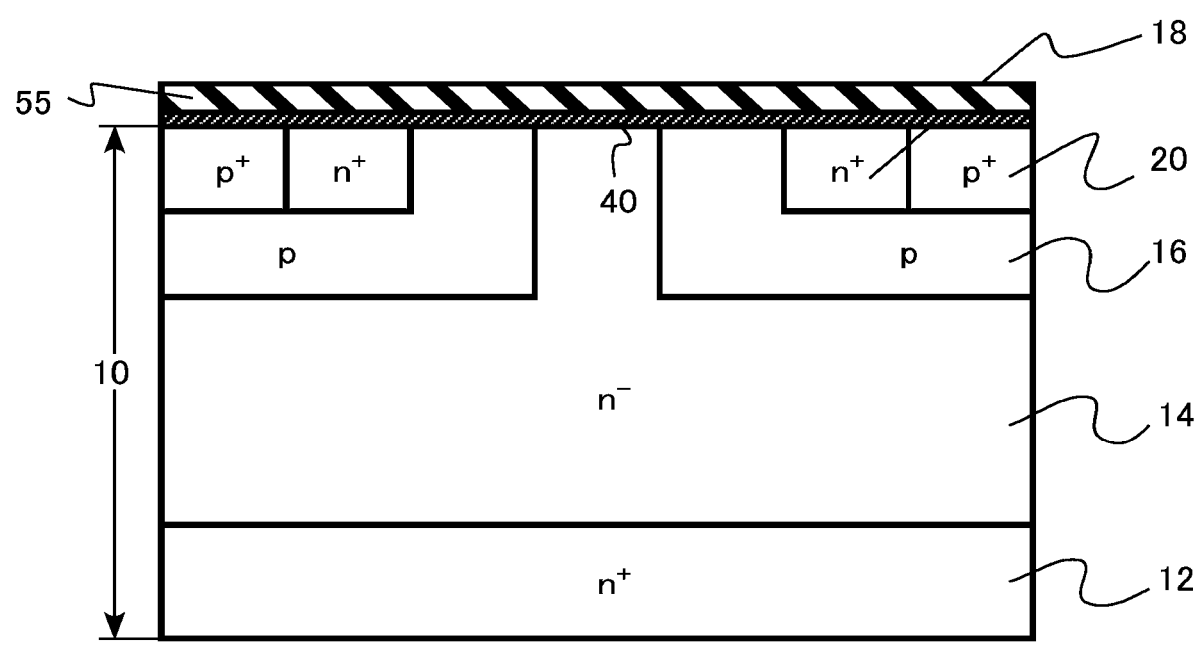
FIG. 16 is an explanatory view of the semiconductor device manufacturing method according to the first embodiment.

Due to the second heat treatment, the interface termination region 40 is formed at the interface between the silicon carbide layer 10 and silicon oxide film (FIG. 16).

The second heat treatment also functions as annealing for densification of the silicon oxide film. Due to the second heat treatment, the silicon oxide film becomes a high-density film.

In step S110, the third heat treatment is performed. The third heat treatment is performed in an atmosphere containing nitrogen oxide gas (NOx). The nitrogen oxide gas is nitrogen monoxide gas (NO), for example. Furthermore, the nitrogen oxide gas is nitrous oxide gas ($N_2O$), for example.

For example, the heat treatment is performed by supplying nitrogen oxide gas (NOx) to a reactor into which the silicon carbide layer 10 has been placed.

The temperature of the third heat treatment is equal to or more than 750° C. and equal to or less than 1050° C., for example. The temperature of the third heat treatment is lower than the temperature of the second heat treatment, for example.

The partial pressure of the nitrogen oxide gas in the atmosphere of the third heat treatment is equal to or more than 10%, for example.

Due to the third heat treatment, the nitrogen in the silicon oxide film is removed. Due to the third heat treatment, a silicon oxide film with reduced nitrogen defects is formed.

In step S111, the gate electrode 30 is formed on the gate insulating layer 28. The gate electrode 30 is polycrystalline silicon containing an n-type impurity or a p-type impurity, for example.

Figure 17:
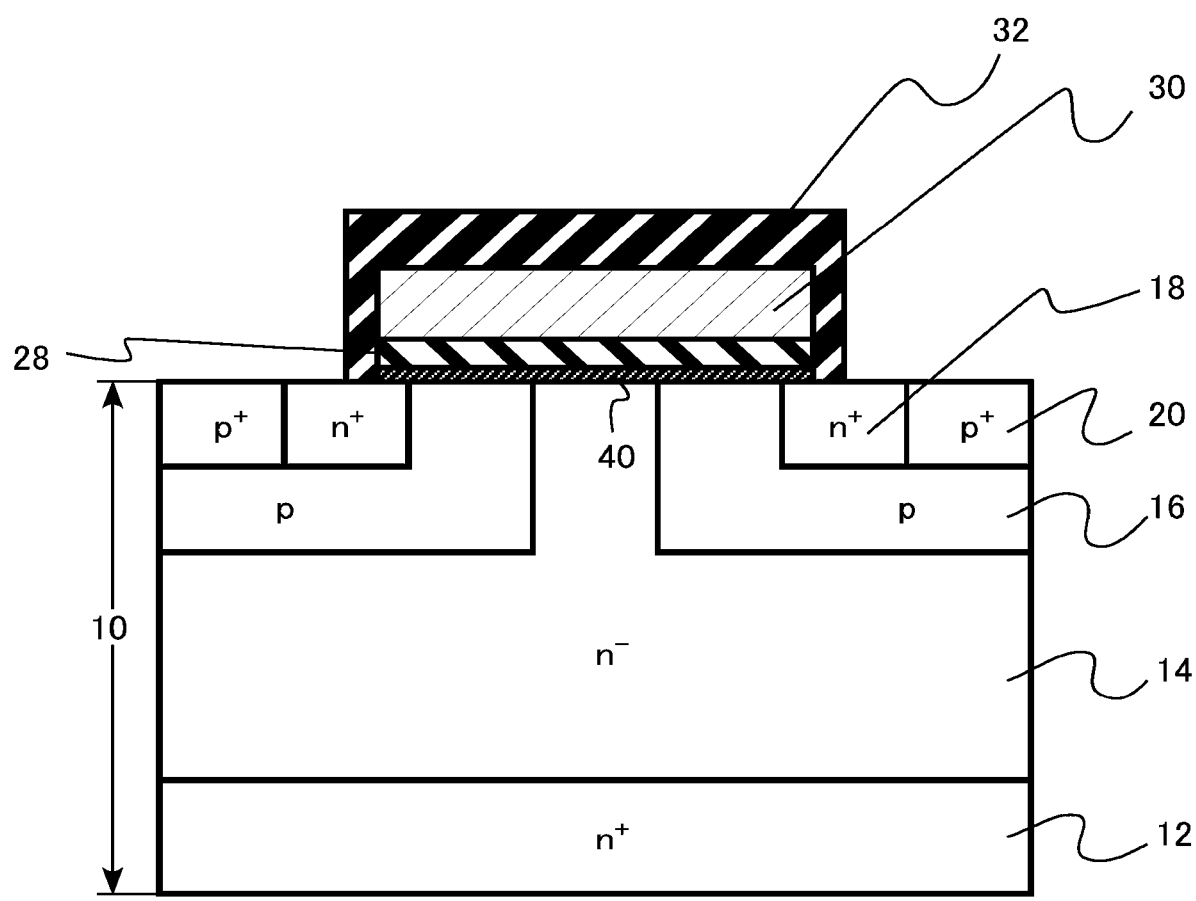
FIG. 17 is an explanatory view of the semiconductor device manufacturing method according to the first embodiment.

In step S112, the interlayer insulating film 32 is formed on the gate electrode 30 (FIG. 17). The interlayer insulating film 32 is a silicon oxide film, for example.

In step S113, the source electrode 34 is formed. The source electrode 34 is formed on the source region 18 and the p-well contact region 20. The source electrode 34 is formed through sputtering of nickel (Ni) and aluminum (Al), for example.

In step S114, the drain electrode 36 is formed. The drain electrode 36 is formed on the back-face side of the silicon carbide layer 10. The drain electrode 36 is formed through nickel sputtering, for example.

The MOSFET 100 illustrated in FIG. 1 is formed by means of the foregoing manufacturing method.

Next, the function and effect of the semiconductor device and the semiconductor device manufacturing method according to the first embodiment will be described.

The MOSFET 100 according to the first embodiment can suppress a reduction in carrier mobility through a reduction in the quantity of carbon vacancies in the silicon carbide layer 10. Furthermore, the method for manufacturing the MOSFET 100 according to the first embodiment reduces the quantity of carbon vacancies in the silicon carbide layer 10 by performing ion implantation of carbon in addition to aluminum ion implantation. Details are provided hereinbelow.

When the MOSFET is formed by using silicon carbide, there is a problem in that carrier mobility is reduced. One cause of reduced carrier mobility is thought to be the interface state between the silicon carbide layer and the gate insulating layer. The interface state is thought to be generated by the dangling bonds present at the surface of the silicon carbide layer.

The MOSFET 100 according to the first embodiment is provided with the interface termination region 40 in which nitrogen is segregated between the silicon carbide layer 10 and the gate insulating layer 28. In the interface termination region 40, dangling bonds are reduced due to the nitrogen atoms bonding to silicon atoms in a tri-coordinated manner. A MOSFET in which a reduction in carrier mobility is suppressed is thus achieved.

Equal to or more than 90% of the nitrogen atoms present in the interface termination region 40 are preferably tricoordinate nitrogen atoms, and more preferably equal to or more than 99% thereof are tricoordinate nitrogen atoms. The concentration of tricoordinate nitrogen atoms is equal to or more than $1 \times 10^{21}$ $cm^{-3}$, for example. The concentration of tetracoordinate nitrogen atoms is equal to or less than $1 \times 10^{19}$ $cm^{-3}$, for example. The concentration of tetracoordinate nitrogen atoms is preferably equal to or less than $1 \times 10^{18}$ $cm^{-3}$ and more preferably equal to or less than $1 \times 10^{17}$ $cm^{-3}$.

From the perspective of suppressing a reduction in the carrier mobility of the MOSFET 100, the peak nitrogen concentration in the interface termination region 40 of the nitrogen concentration distribution is preferably equal to or more than $1 \times 10^{22}$ $cm^{-3}$ and more preferably equal to or more than $5 \times 10^{22}$ $cm^{-3}$.

When there is excess nitrogen, the excess nitrogen becomes a charge trap. Accordingly, the peak nitrogen concentration in the interface termination region 40 of the nitrogen concentration distribution is preferably equal to or less than $1 \times 10^{23}$ $cm^{-3}$.

The peak nitrogen concentration in the interface termination region 40 of the nitrogen concentration distribution is preferably $5.0 \times 10^{22}$ $cm^{-3} \pm 5\%$. When the peak nitrogen concentration is in the range $5.0 \times 10^{22}$ $cm^{-3} \pm 5\%$, the MOSFET 100 exhibits favorable characteristics with minimal charge trapping.

The nitrogen area density of the interface termination region 40 is preferably equal to or more than $1 \times 10^{14}$ $cm^{-2}$ and equal to or less than $2.5 \times 10^{15}$ $cm^{-2}$. The nitrogen area density of the interface termination region 40 is preferably $1.4 \times 10^{15}$ cm$^{-2}$ ±5%. When the nitrogen area density is in the foregoing range, the MOSFET 100 exhibits favorable characteristics with minimal charge trapping.

Furthermore, when the MOSFET is formed using silicon carbide, there is a problem in that carrier mobility is reduced and fluctuations in the threshold voltage arise. There is also a problem in that the leakage current of the gate insulating layer increases, and the reliability of the gate insulating layer is reduced. One cause of the foregoing problems is thought to be the carbon defects and nitrogen defects present in the gate insulating layer.

The carbon defects and nitrogen defects are thought to be the cause of the foregoing problems due to their forming a trap level in the gate insulating layer.

In the MOSFET 100 according to the first embodiment, the nitrogen concentration in a second position X2 spaced apart by 1 nm from the peak of the nitrogen concentration distribution in the interface termination region 40, toward the gate insulating layer 28, is equal to or less than $1 \times 10^{18}$ cm$^{-3}$, and the carbon concentration in the second position X2 is equal to or less than $1 \times 10^{18}$ cm$^{-3}$. In the MOSFET 100, the carbon and nitrogen concentrations in the gate insulating layer 28 are low. Thus, the quantity of carbon defects and nitrogen defects in the gate insulating layer 28 is sufficiently reduced. Accordingly, a reduction in carrier mobility, threshold voltage fluctuations, an increase in the leakage current of the gate insulating layer, or a reduction in the reliability of the gate insulating layer, which are caused by carbon defects and nitrogen defects, are suppressed.

The nitrogen concentration in second position X2 spaced apart by 1 nm from the peak of the nitrogen concentration distribution in the interface termination region 40, toward the gate insulating layer 28, is preferably equal to or less than $1 \times 10^{17}$ cm$^{-3}$ and more preferably equal to or less than $1 \times 10^{16}$ cm$^{-3}$.

Furthermore, another cause of the problem of reduced carrier mobility when the MOSFET is formed using silicon carbide is thought to be the presence of carbon vacancy in the silicon carbide layer 10.

For example, it is thought that carriers are scattered and carrier mobility is reduced due to the presence of carbon vacancy in the channel formation region of a MOSFET.

The MOSFET 100 according to the first embodiment has a state density $Z_{1/2}$ measured using DLTS of equal to or less than $1 \times 10^{11}$ cm$^{-3}$ in the channel portion 16a between the gate insulating layer 28 and a first position X1 spaced apart by 100 nm from the gate insulating layer 28 toward the silicon carbide layer 10.

The state density $Z_{1/2}$ measured using DLTS corresponds to the density of carbon vacancies. Because the state density $Z_{1/2}$ is equal to or less than $1 \times 10^{11}$ cm$^{-3}$, the density of carbon vacancies below the gate insulating layer 28 is equal to or less than $1 \times 10^{11}$ cm$^{-3}$. The density of carbon vacancies below the channel portion 16a of the gate insulating layer 28 is sufficiently reduced. Hence, a reduction in the carrier mobility due to carbon vacancies in the silicon carbide layer 10 is suppressed.

The state density $Z_{1/2}$ measured using DLTS is preferably equal to or less than $5 \times 10^{10}$ cm$^{-3}$ and more preferably equal to or less than $1 \times 10^{10}$ cm$^{-3}$. That is, the density of carbon vacancies below the gate insulating layer 28 is preferably equal to or less than $5 \times 10^{10}$ cm$^{-3}$ and more preferably equal to or less than $1 \times 10^{10}$ cm$^{-3}$. Hence, a reduction in the carrier mobility due to carbon vacancies in the silicon carbide layer 10 is further suppressed.

In the MOSFET 100, the quantity of nitrogen atoms bonded to the four silicon atoms in a fourth position X4 spaced apart by 5 nm from the gate insulating layer 28 toward the silicon carbide layer 10 is equal to or more than 80% and equal to or less than 120% of the quantity of nitrogen atoms bonded to the four silicon atoms in a fifth position X5 spaced apart by 5 µm from the gate insulating layer 28 toward the silicon carbide layer 10. In other words, the quantity of tetracoordinate nitrogen atoms in the fourth position X4 is equal to or more than 80% and equal to or less than 120% of the quantity of tetracoordinate nitrogen atoms in the fifth position X5. The tetracoordinate nitrogen atoms function as donors.

The nitrogen concentration in the fourth position X4 is preferably equal to or less than $1 \times 10^{18}$ cm$^{-3}$, more preferably equal to or less than $1 \times 10^{17}$ cm$^{-3}$, and even more preferably equal to or less than $2 \times 10^{16}$ cm$^{-3}$. The nitrogen concentration in the fifth position X5 is preferably equal to or less than $1 \times 10^{18}$ cm$^{-3}$, more preferably equal to or less than $1 \times 10^{17}$ cm$^{-3}$, and even more preferably equal to or less than $2 \times 10^{16}$ cm$^{-3}$.

In the MOSFET 100, because the density of the carbon vacancies in the channel portion 16a is low, the density of carbon vacancies in the channel portion 16a and the density of carbon vacancies in the drift region 14 are substantially equal. Hence, the quantity of tetracoordinate nitrogen atoms filling the carbon vacancies in the channel portion 16a and the quantity of tetracoordinate nitrogen atoms filling the carbon vacancies in the drift region 14 are substantially equal. Accordingly, the quantity of tetracoordinate nitrogen atoms in the channel portion 16a is equal to or more than 80% and equal to or less than 120% of the tetracoordinate nitrogen atoms in the drift region 14.

The MOSFET 100 according to the first embodiment has a sufficiently low carbon vacancy density in the channel portion 16a. Hence, the Hall mobility of the electrons in the channel portion 16a is equal to or more than 200 cm$^2$/V·s. The Hall mobility of the electrons in the channel portion 16a is preferably equal to or more than 350 cm$^2$/V·s and more preferably equal to or more than 450 cm$^2$/V·s.

The field effect mobility, which represents an indicator of a MOSFET ON current, is determined according to the percentage of mobile charge in the Hall mobility. That is, the field effect mobility is smaller than the Hall mobility. At a silicon-carbide MOS interface, because the interface termination efficiency is poor and there are large quantities of substrate defects and defects in the gate insulating layer, the percentage of mobile charge is low. Charge other than mobile charge is trapped charge.

The percentage of mobile charge can be improved by optimizing the interface termination method and termination quality, for example. However, a low Hall mobility makes it difficult to significantly improve the field effect mobility. In order to significantly improve the field effect mobility, the Hall mobility is desirably improved to equal to or more than 150 cm$^{-2}$/V·s.

According to the first embodiment, the Hall mobility can be significantly improved by reducing the density of carbon vacancies. The Hall mobility is equal to or more than 200 cm$^2$/V·s, for example. By further reducing the density of carbon vacancies, a Hall mobility of equal to or more than 350 cm$^2$/V·s and even equal to or more than 450 cm$^2$/V·s is achieved.

In addition, in the case of the MOSFET 100 according to the first embodiment, the nitrogen concentration in the third position X3 spaced apart by 1 nm from the peak of the nitrogen concentration distribution in the interface termination region 40 toward the silicon carbide layer is equal to or less than $1\times10^{18}$ cm$^{-3}$. Because the nitrogen concentration is low in the silicon carbide layer 10 close to the gate insulating layer 28, a high threshold voltage for the MOSFET 100 can be achieved.

The nitrogen concentration in the third position X3 spaced apart by 1 nm from the peak of the nitrogen concentration distribution in the interface termination region 40 toward the silicon carbide layer is equal to or less than $1\times10^{18}$ cm$^{-3}$. The nitrogen concentration in the third position X3 is preferably equal to or less than $1\times10^{17}$ cm$^{-3}$, and more preferably equal to or less than $2\times10^{16}$ cm$^{-3}$.

In manufacturing a MOSFET, the following three processes may be considered as manufacturing processes in which carbon vacancies that reduce carrier mobility are generated in the silicon carbide layer.

The first process is ion implantation of impurity into the silicon carbide layer. Carbon vacancy and interstitial carbon are formed in the silicon carbide layer 10 due to the energy of the ion-implanted impurity.

The second process is activation annealing to activate the impurity introduced to the silicon carbide layer through ion implantation. In order to reduce free energy of the type of the silicon carbide layer during activation annealing, carbon vacancy and interstitial carbon are generated in the silicon carbide layer, and entropy increases. The quantity of carbon vacancy and interstitial carbon thus generated increases as the activation annealing temperature rises.

The third process is a process for oxidizing the surface of the silicon carbide layer. The third process is, for example, a process for forming the gate insulating layer by means of thermal oxidation or a process that uses a nitrogen oxide gas to form an interface termination region. During oxidation, carbon vacancy and interstitial carbon are formed in the silicon carbide layer due to distortion generated in the surface of the silicon carbide layer.

In the method for manufacturing the MOSFET 100 according to the first embodiment, ion implantation of carbon in the same region of the silicon carbide layer 10 is carried out after performing ion implantation of aluminum to form the p-well region 16 in the silicon carbide layer 10. The second dose amount of carbon is equal to or more than ten times the first dose amount of aluminum.

In the method for manufacturing the MOSFET 100 according to the first embodiment, surplus interstitial carbon is present in a large quantity in the p-well region 16 due to the carbon ion implantation. As a result of the heat treatment performed after the carbon ion implantation, the carbon vacancies generated in the aluminum ion implantation are filled with the surplus interstitial carbon. The quantity of carbon vacancies in the p-well region 16 is therefore reduced.

From the perspective of suitably maintaining the p-type impurity concentration of the p-well region 16, the first dose amount of aluminum is preferably equal to or less than $1\times10^{14}$ cm$^{-2}$. From the perspective of reducing the quantity of carbon vacancies in the p-well region 16, the second dose amount of carbon is preferably equal to or more than $1\times10^{15}$ cm$^{-2}$ and more preferably equal to or more than $1\times10^{16}$ cm$^{-2}$.

From the perspective of reducing the quantity of carbon vacancies in the p-well region 16, the second dose amount of carbon is preferably equal to or more than one hundred times the first dose amount of aluminum.

From the perspective of reducing the quantity of carbon vacancies in the p-well region 16, a second projected range Rp2 for the carbon ion implantation is preferably equal to or more than 80% and equal to or less than 120% of a first projected range Rp1 for the aluminum ion implantation, and more preferably equal to or more than 90% and equal to or less than 110%.

By bringing the first projected range Rp1 and second projected range Rp2 closer together, the carbon concentration distribution after ion implantation easily completely covers the aluminum concentration distribution after ion implantation. Because the carbon concentration distribution after ion implantation completely covers the aluminum concentration distribution after ion implantation, the quantity of carbon vacancies in the p-well region 16 is reduced.

From the perspective of suitably maintaining the depth of the p-well region 16, the first projected range Rp1 and the second projected range Rp2 are preferably equal to or less than 0.6 µm.

In the method for manufacturing the MOSFET 100 according to the first embodiment, during the first heat treatment to activate the aluminum that has been introduced to the silicon carbide layer 10 through ion implantation, surplus interstitial carbon comes to be present in a large quantity in the silicon carbide layer 10. Because a large quantity of interstitial carbon is present, an increase in the entropy required to reduce the free energy of the type of the silicon carbide layer 10 is obtained. Hence, an increase in the carbon vacancies in the silicon carbide layer 10 due to the first heat treatment is suppressed.

In the method for manufacturing the MOSFET 100 according to the first embodiment, because surplus interstitial carbon is present in a large quantity in the silicon carbide layer 10 during the first heat treatment, the entry of aluminum atoms into the carbon sites of the silicon carbide is suppressed. Therefore, the entry of aluminum atoms into the silicon sites of the silicon carbide is promoted. The activation rate of aluminum is accordingly improved.

Furthermore, in the method for manufacturing the MOSFET 100 according to the first embodiment, because surplus interstitial carbon is present in a large quantity in the silicon carbide layer 10 during the first heat treatment, an increase in the quantity of carbon vacancies in the silicon carbide layer 10 is suppressed even when the first heat treatment is performed at a high temperature. Therefore, the first heat treatment can be performed at a high temperature. The aluminum activation rate can accordingly be improved.

From the perspective of improving the aluminum activation rate, the temperature of the first heat treatment is preferably equal to or more than 1850° C. and more preferably equal to or more than 1900° C.

The first heat treatment is preferably configured from a first step at equal to or more than 1600° C. and a second step at a lower temperature than the first step. The second step is preferably at equal to or less than 1000° C. The heat treatment time of the second step is longer than the heat treatment time of the first step.

In the first step, the aluminum and phosphorus, which have been ion-implanted in the silicon carbide layer 10, are activated, and the interstitial carbon fills the carbon vacancy. The interstitial carbon is at a surplus even at the stage where the carbon vacancies have been filled. Further, in the low-temperature second step, the surplus interstitial carbon is driven out from the silicon carbide layer 10 and absorbed by the carbon film 54.

By performing the second step at a low temperature, an increase in carbon vacancies is suppressed. The interstitial carbon in the silicon carbide layer 10 can be reduced in the second step. Hence, the first heat treatment and subsequent heat treatments make it possible to suppress an increase in carbon defects in the gate insulating layer 28.

In the method for manufacturing the MOSFET 100 according to the first embodiment, the gate insulating layer 28 is formed using vapor phase growth method. Hence, oxidation of the surface of the silicon carbide layer 10 is suppressed. An increase in the carbon vacancies in the silicon carbide layer 10 during formation of the gate insulating layer 28 is accordingly suppressed.

Furthermore, in the method for manufacturing the MOSFET 100 according to the first embodiment, the interface termination region 40 is formed by means of a second heat treatment in an atmosphere containing ammonia gas ($NH_3$). In an atmosphere containing ammonia gas, an increase in carbon vacancies in the silicon carbide layer 10 is suppressed by forming the interface termination region 40 without interface oxidation.

Furthermore, because the second heat treatment does not involve oxidation, excess carbon is not discharged from the silicon carbide layer 10. Accordingly, dispersion of excess carbon in the gate insulating layer, thereby forming carbon defects in the gate insulating layer, is suppressed.

The conditions for the second heat treatment are preferably adjusted to enable formation of an interface termination region 40 into which sufficient nitrogen has been introduced. The second heat treatment is carried out in a low oxygen state where the oxygen partial pressure is equal to or less than 1 ppm, for example. The second heat treatment is a high-temperature treatment at equal to or more than 1200° C. and equal to or less than 1600° C., for example. From the perspective of increasing the nitrogen concentration in the interface termination region 40, the second heat treatment is preferably performed at equal to or more than 1300° C. and more preferably at equal to or more than 1400° C.

Even when nitrogen is introduced to the gate insulating layer, as long as carbon does not coexist in the gate insulating layer, composite defects (C—O—N defects) are not formed by the nitrogen and carbon. Therefore, the second heat treatment can be performed for a long time. The second heat treatment can accordingly be performed for a long time until the nitrogen in the interface termination region 40 reaches a sufficient quantity, for example, equal to or more than $1 \times 10^{22}$ $cm^{-3}$. The second heat treatment may be performed for one hour at 1300° C., for example, or for 30 minutes at 1400° C., for example.

The interface termination region 40 can also be formed with interface oxidation by using a high-temperature treatment with nitrogen monoxide (NO), or the like, for example. In this case, carbon vacancies are formed in the silicon carbide layer due to the distortion that occurs in the surface of the silicon carbide layer during interface oxidation. Thus, there may be another increase in carbon vacancies even if the carbon vacancies have been reduced prior to formation of the interface termination region 40. That is, when the interface termination region 40 with interface oxidation is formed, even when carbon vacancies are reduced prior to formation of the interface termination region 40, there is ultimately no reduction in carbon vacancies.

Moreover, when the interface termination region 40 is to be formed with interface oxidation by using a high-temperature treatment with nitrogen monoxide (NO), or the like, the substrate is oxidized and surplus carbon is emitted from the silicon carbide layer 10. There is also the problem that the emitted carbon is dispersed within the gate insulating layer and a large quantity of carbon defects are generated in the gate insulating layer.

Note that, even when the second heat treatment is performed in a second atmosphere containing nitrogen gas and hydrogen gas, or in a third atmosphere containing nitrogen gas and carbon dioxide gas, an increase in carbon vacancies in the silicon carbide layer 10 can be suppressed.

In the method for manufacturing the MOSFET 100 according to the first embodiment, a third heat treatment is carried out in an atmosphere containing nitrogen oxide gas (NOx) after the second heat treatment to form the interface termination region 40.

Due to the third heat treatment, the nitrogen in the gate insulating layer 28 is removed. Due to the third heat treatment, a gate insulating layer 28 with reduced nitrogen defects is formed.

From the perspective of suppressing oxidation of the surface of the silicon carbide layer 10 by means of the third heat treatment, the temperature of the third heat treatment is preferably lower than the temperature of the second heat treatment.

From the perspective of reducing nitrogen defects in the gate insulating layer 28, the temperature of the third heat treatment is preferably equal to or more than 800° C., more preferably equal to or more than 850° C., and even more preferably equal to or more than 925° C.

From the perspective of reducing nitrogen defects in the gate insulating layer 28, the nitrogen oxide gas of the third heat treatment is preferably nitrous oxide gas ($N_2O$), which has a high oxidizing power.

From the perspective of suppressing the oxidation of the silicon carbide layer 10, the temperature of the third heat treatment is preferably equal to or less than 1000° C. and more preferably equal to or less than 950° C.

In the method for manufacturing the MOSFET 100 according to the first embodiment, the interface termination region 40, into which sufficient nitrogen has been introduced, is formed by means of the second heat treatment. The second heat treatment is preferably performed in a low oxygen state where the oxygen partial pressure is equal to or less than 1 ppm, at a high temperature, and over a long time period. Due to the second heat treatment, the oxidation resistance of the silicon carbide layer 10 is improved.

Hence, as long as the third heat treatment is performed at a high temperature of 1050° C., for example, and for equal to or less than five minutes, for example, oxidation of the surface of the silicon carbide layer 10 is suppressed. In order to reliably drive out the nitrogen from the gate insulating layer 28, a low-temperature treatment over a long time period, which presents a diminished risk of oxidation of the surface of the silicon carbide layer 10, is preferable. For example, the third heat treatment is preferably a heat treatment using nitrous oxide gas ($N_2O$) at 950° C. for three hours.

By measuring the fact that a change in the capacitance of the gate MOS capacitor, for example, is not generated after the third heat treatment, it can be confirmed that oxidation of the surface of the silicon carbide layer 10 has not occurred. Alternatively, if a TEM image is viewed directly, it can be confirmed that an oxide layer has not grown on the surface of the silicon carbide layer 10.

It may be said that the premise of the third heat treatment is that oxidation resistance of the silicon carbide layer 10 is improved by the second heat treatment. If the second treatment is not carried out suitably, the surface of the silicon carbide layer 10 is oxidized by the third treatment. Carbon vacancies will form in the silicon carbide layer 10 due to the oxidation, which is undesirable.

In the method for manufacturing the MOSFET 100 according to the first embodiment, because oxidation of the surface of the silicon carbide layer is suppressed, the quantity of carbon in the gate insulating layer 28 is reduced, and the quantity of carbon defects in the gate insulating layer 28 is also diminished.

Furthermore, in the method for manufacturing the MOSFET 100 according to the first embodiment, because an increase in the carbon vacancies in the silicon carbide layer 10 is suppressed, nitrogen atoms are prevented from entering carbon vacancies and becoming donors when the interface termination region 40 is formed, for example. A reduction in the threshold voltage of the MOSFET 100 is therefore suppressed.

According to the first embodiment hereinabove, a semiconductor device and semiconductor device manufacturing method are realized that enable a reduction in carrier mobility to be suppressed by reducing the quantity of carbon vacancies in the silicon carbide layer.

Second Embodiment

The semiconductor device manufacturing method according to the second embodiment differs from the semiconductor device manufacturing method according to the first embodiment in that the second heat treatment is performed in a nitrogen-containing atmosphere prior to formation of the silicon oxide film. Portions of the details of points in common with the first embodiment are omitted from the description hereinbelow.

A case where the second heat treatment is performed using a first atmosphere containing ammonia gas will be described by way of an example hereinbelow.

Figure 18:
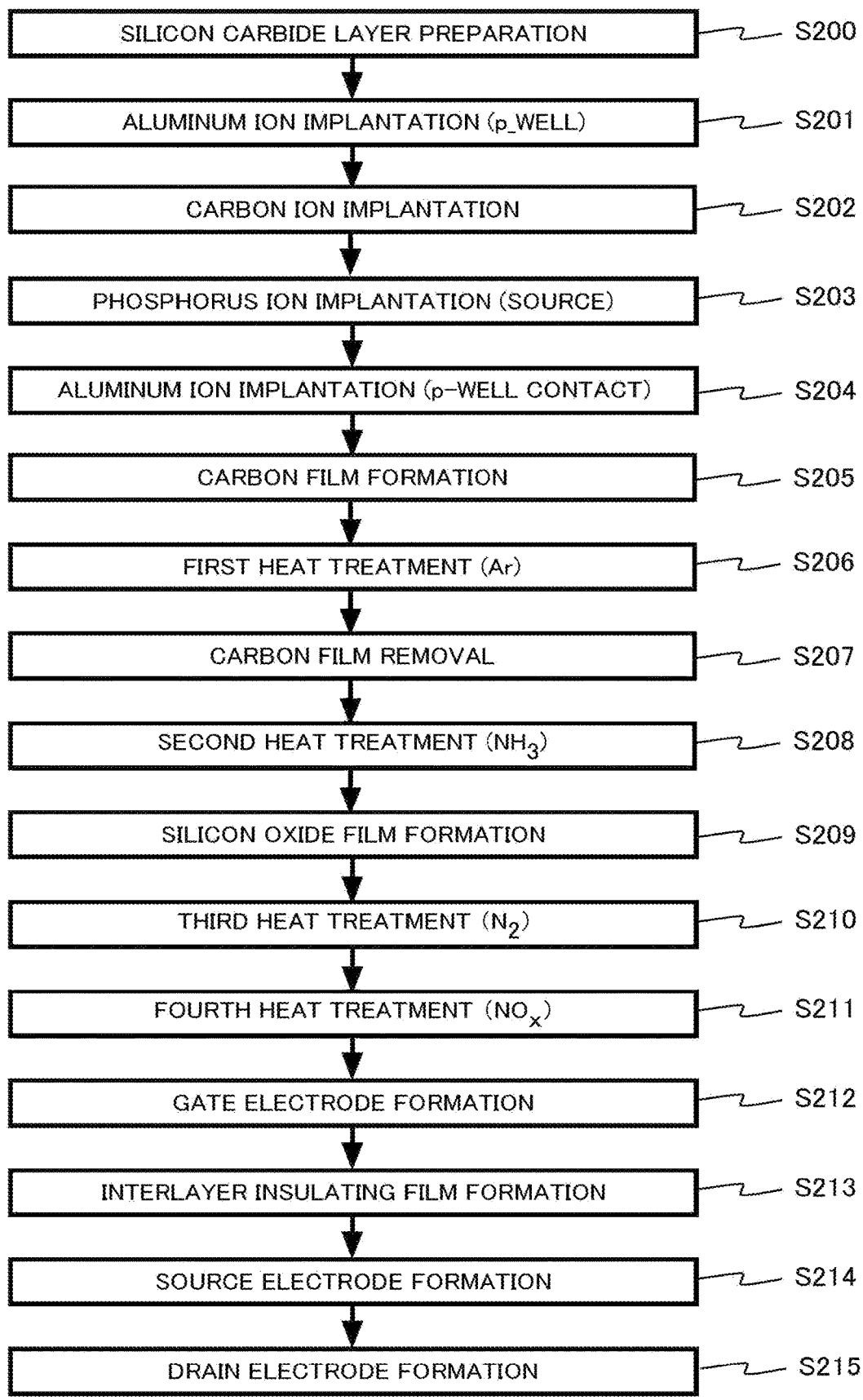
FIG. 18 is a process flow diagram of a semiconductor device manufacturing method according to a second embodiment.

FIG. 18 is a process flow diagram of a semiconductor device manufacturing method according to a second embodiment. The MOSFET 100 illustrated in FIG. 1 is formed using the semiconductor device manufacturing method according to the second embodiment.

As illustrated in FIG. 18, the semiconductor device manufacturing method according to the second embodiment includes silicon carbide layer preparation (step S200), aluminum ion implantation (step S201), carbon ion implantation (step S202), phosphorus ion implantation (step S203), aluminum ion implantation (step S204), carbon film formation (step S205), a first heat treatment (step S206), carbon film removal (step S207), a second heat treatment (step S208), silicon oxide film formation (step S209), a third heat treatment (step S210), a fourth heat treatment (step S211), gate electrode formation (step S212), interlayer insulating film formation (step S213), source electrode formation (step S214), and drain electrode formation (step S215).

In step S200, the silicon carbide layer 10 is prepared. The silicon carbide layer 10 is provided with an n$^+$-type drain region 12 and an n$^-$-type drift region 14.

In step S201, a first mask material is formed. Further, by using the first mask material as an ion implantation mask, aluminum is ion-implanted in the drift region 14. The p-well region 16 is formed through the ion implantation.

Ion implantation to form the p-well region 16 is an example of the first ion implantation. Aluminum ion implantation is performed in the first projected range and using the first dose amount.

In step S202, the first mask material is used as an ion implantation mask, and carbon is ion-implanted in the p-well region 16. The ion implantation of carbon in the p-well region 16 is an example of the second ion implantation. Carbon ion implantation is performed in the second projected range and using the second dose amount. Thereafter, the first mask material is removed.

In step S203, a second mask material is formed. Further, by using the second mask material as an ion implantation mask, phosphorus, constituting an n-type impurity, is ion-implanted in the drift region 14, and the source region 18 is formed. Thereafter, the second mask material is removed.

In step S204, a third mask material is formed. By using the third mask material as an ion implantation mask, aluminum, constituting a p-type impurity, is ion-implanted in the drift region 14, and the p-well contact region 20 is formed. Thereafter, the third mask material is removed.

In step S205, the carbon film is formed on the silicon carbide layer 10.

In step S206, a first heat treatment is performed. The first heat treatment is performed at equal to or more than 1600° C. The first heat treatment is performed in a non-oxidizing atmosphere. The first heat treatment is performed in an inert gas atmosphere, for example. The first heat treatment is performed in an argon gas atmosphere, for example.

The aluminum and phosphorus, which have been ion-implanted in the silicon carbide layer 10, are activated through the first heat treatment. The first heat treatment is activation annealing of aluminum and phosphorus.

In step S207, the carbon film is removed.

In step S208, the second heat treatment is performed. The second heat treatment is performed in an atmosphere containing ammonia gas ($NH_3$).

Due to the second heat treatment, the interface termination region 40 is formed on the surface of the silicon carbide layer 10.

In step S209, a silicon oxide film is formed on the silicon carbide layer 10. The silicon oxide film ultimately becomes the gate insulating layer 28. The silicon oxide film is formed using vapor phase growth method, for example.

In step S210, the third heat treatment is performed. The third heat treatment is performed in an inert gas-containing atmosphere. The second heat treatment is performed in a non-oxidizing atmosphere in which the surface of the silicon carbide layer 10 is not oxidized.

For example, the heat treatment is performed by supplying argon gas (Ar) or nitrogen gas ($N_2$) to a reactor into which the silicon carbide layer 10 has been placed.

The temperature of the third heat treatment is equal to or more than 1000° C. and equal to or less than 1400° C., for example.

The third heat treatment also functions as annealing for densification of the silicon oxide film. Due to the third heat treatment, the silicon oxide film becomes a high-density film.

In step S211, the fourth heat treatment is performed. The fourth heat treatment is performed in an atmosphere containing nitrogen oxide gas (NOx). Due to the fourth heat treatment, the nitrogen in the silicon oxide film is removed.

In step S212, the gate electrode 30 is formed on the gate insulating layer 28.

In step S213, the interlayer insulating film 32 is formed on the gate electrode 30.

In step S214, the source electrode 34 is formed.

In step S215, the drain electrode 36 is formed.

The MOSFET 100 illustrated in FIG. 1 is formed by means of the foregoing manufacturing method.

According to the second embodiment hereinabove, a semiconductor device manufacturing method is realized that, like the first embodiment, enables a reduction in carrier mobility to be suppressed by reducing the quantity of carbon vacancies in the silicon carbide layer.

Third Embodiment

A semiconductor device according to a third embodiment differs from the first embodiment in that the third embodiment is a trench gate MOSFET in which a gate electrode is provided in a trench. Portions of the details of points in common with the first embodiment are omitted from the description hereinbelow.

Figure 19:
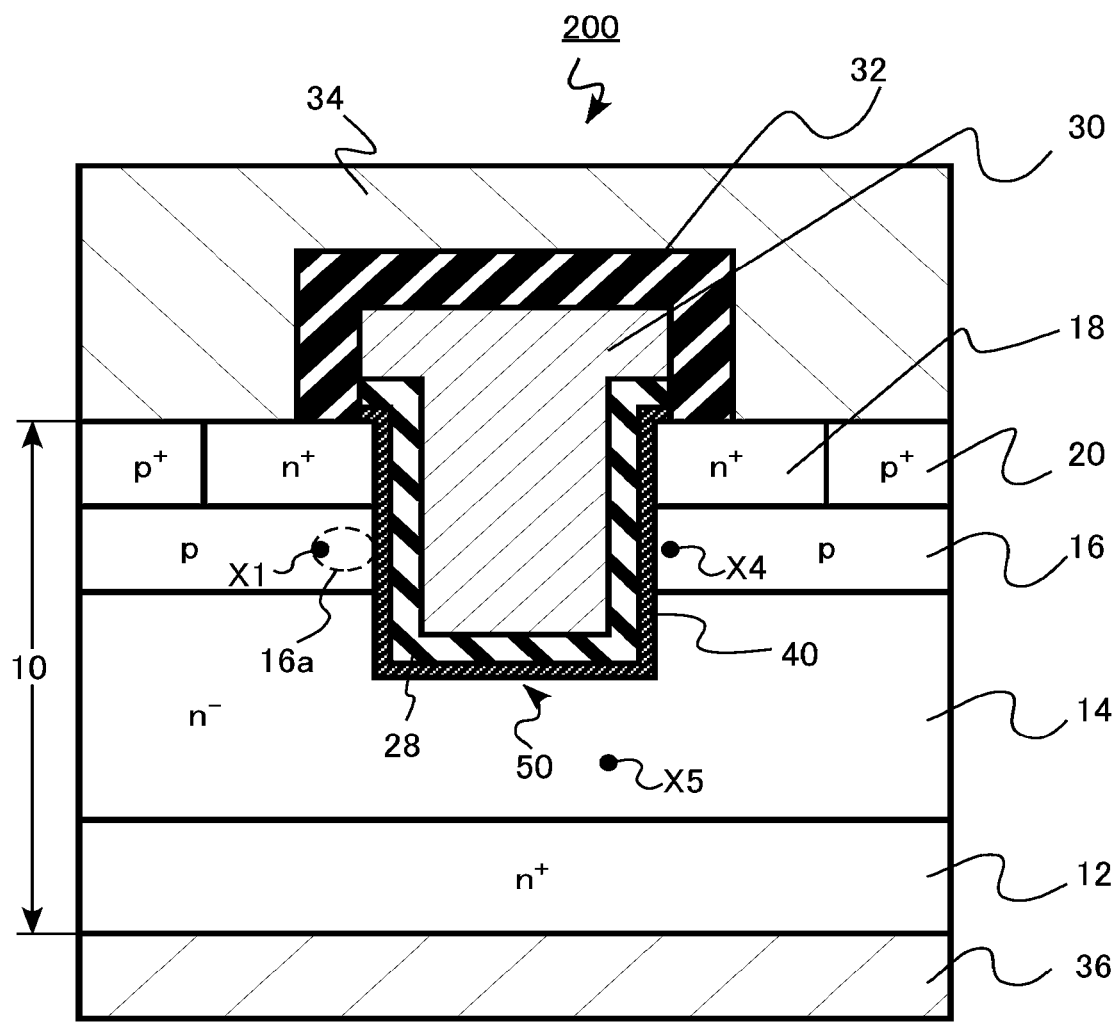
FIG. 19 is a schematic cross-sectional view of a semiconductor device according to a third embodiment.

FIG. 19 is a schematic cross-sectional view of a semiconductor device according to the third embodiment. The semiconductor device according to the third embodiment is a MOSFET 200. The MOSFET 200 is a trench gate MOSFET in which a gate electrode is provided in a trench. Further, the MOSFET 200 is an n-channel MOSFET using electrons as carriers.

The MOSFET 200 is provided with a silicon carbide layer 10, a gate insulating layer 28 (silicon oxide layer), a gate electrode 30, an interlayer insulating film 32, a source electrode 34, a drain electrode 36, an interface termination region 40 (region), and a trench 50.

The silicon carbide layer 10 is provided with a drain region 12, a drift region 14, a p-well region 16, a source region 18, and a p-well contact region 20.

The trench 50 penetrates the source region 18 and the p-well region 16 and reaches the drift region 14. The bottom surface of the trench 50 is disposed in the drift region 14.

The gate insulating layer 28 and gate electrode 30 are provided in the trench 50. The lateral surfaces of the trench 50 are surfaces provided with an OFF angle of equal to or more than 0 degrees and equal to or less than 8 degrees relative to a face m, for example.

A channel portion 16a is disposed between the gate insulating layer 28 and a first position (X1 in FIG. 19) spaced apart by 100 nm from the gate insulating layer 28 toward the silicon carbide layer 10. The channel portion 16a is disposed in the p-well region 16.

The state density $Z_{1/2}$ of the channel portion 16a is equal to or less than $1\times10^{11}$ cm$^{-3}$, the state density being measured using DLTS.

The Hall mobility of electrons in the channel portion 16a is equal to or more than 200 cm$^2$/V·s, for example.

The interface termination region 40 is disposed between the silicon carbide layer 10 and the gate insulating layer 28. The interface termination region 40 is disposed between the drift region 14 and p-well region 16, and the gate insulating layer 28. The interface termination region 40 contains nitrogen (N) as the termination element terminating the dangling bonds of the silicon carbide layer 10. The interface termination region 40 is an example of a region.

The nitrogen concentration of the interface termination region 40 is equal to or more than $1\times10^{21}$ cm$^{-3}$.

As illustrated in FIG. 3, the nitrogen concentration distribution has its peak in the interface termination region 40. The peak nitrogen concentration is equal to or more than $1\times10^{22}$ cm$^{-3}$, for example. The full-width at half-maximum with respect to the peak of the nitrogen concentration distribution is equal to or less than 1 nm, for example. Nitrogen is segregated at the interface between the silicon carbide layer 10 and the gate insulating layer 28.

The peak nitrogen concentration of the nitrogen concentration distribution is equal to or more than $1\times10^{22}$ cm$^{-3}$, for example.

The nitrogen concentration in a second position X2 spaced apart by 1 nm from the peak of the nitrogen concentration distribution toward the gate insulating layer 28 is equal to or less than $1\times10^{18}$ cm$^{-3}$. Furthermore, the nitrogen concentration in a third position X3 spaced apart by 1 nm from the peak of the nitrogen concentration distribution toward the silicon carbide layer 10 is equal to or less than $1\times10^{18}$ cm$^{-3}$. The nitrogen concentration in the third position X3 is preferably equal to or less than $1\times10^{17}$ cm$^{-3}$, and more preferably equal to or less than $2\times10^{16}$ cm$^{-3}$.

The quantity of nitrogen atoms bonded to the four silicon atoms in a fourth position (X4 in FIG. 19) spaced apart by 5 nm from the gate insulating layer 28 toward the silicon carbide layer 10 is, for example, equal to or more than 80% and equal to or less than 120% of the quantity of nitrogen atoms bonded to the four silicon atoms in a fifth position (X5 in FIG. 19) spaced apart by 5 μm from the gate insulating layer 28 toward the silicon carbide layer 10. In other words, the quantity of tetracoordinate nitrogen atoms in the fourth position X4 is equal to or more than 80% and equal to or less than 120% of the quantity of tetracoordinate nitrogen atoms in the fifth position X5.

The fourth position X4 is disposed in the p-well region 16. The fifth position X5 is disposed in the drift region 14.

According to the third embodiment hereinabove, a semiconductor device is realized that, like the first and second embodiments, enables a reduction in carrier mobility to be suppressed by reducing the quantity of carbon vacancies in the silicon carbide layer. Further, since the semiconductor device has a trench gate structure, the channel density per unit of area of the chip is high, and the on-resistance of the MOSFET is reduced.

Fourth Embodiment

An inverter circuit and a driver device according to a fourth embodiment is an inverter circuit and a driver device, the inverter circuit and the driver device being provided with the semiconductor device according to the first embodiment.

Figure 20:
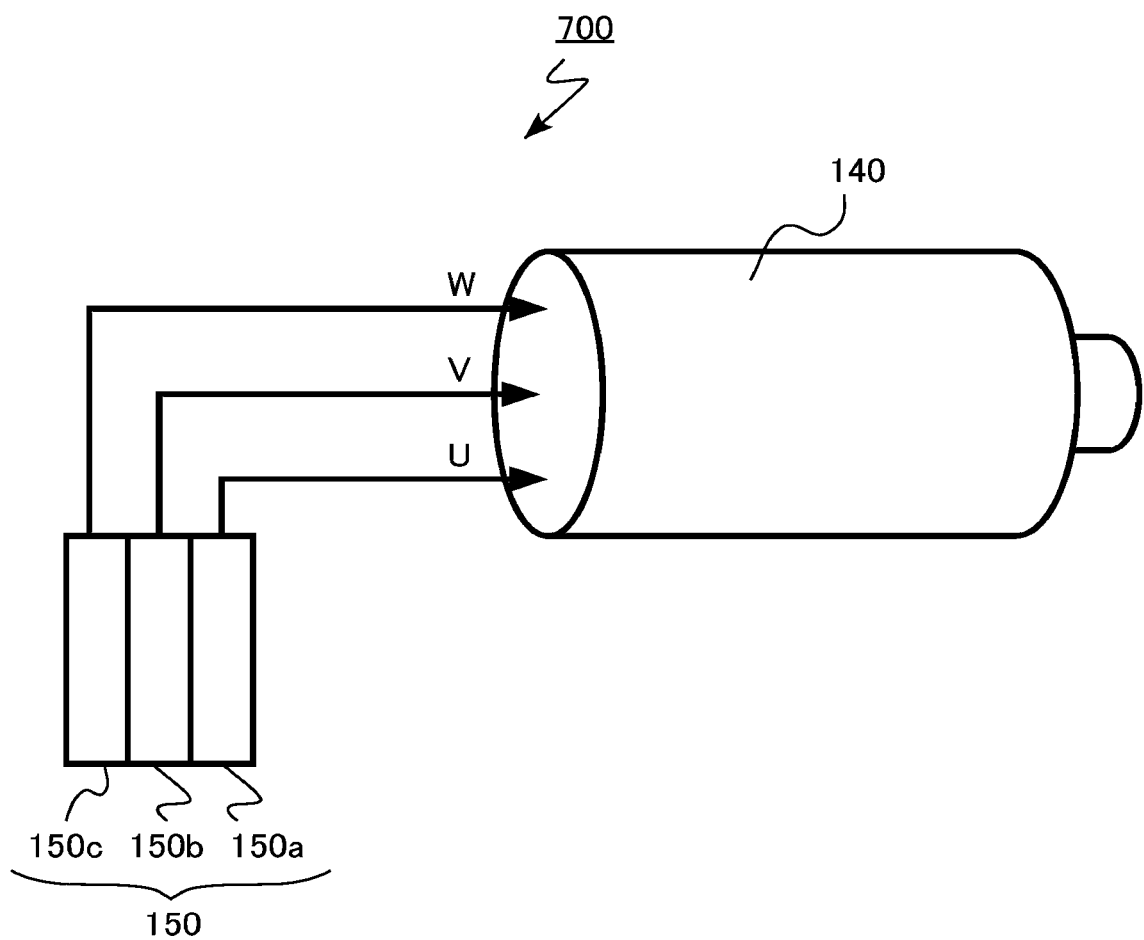
FIG. 20 is a schematic diagram of a driver device according to a fourth embodiment.

FIG. 20 is a schematic diagram of a driver device according to the fourth embodiment. A driver device 700 is provided with a motor 140 and an inverter circuit 150.

The inverter circuit 150 is configured from three semiconductor modules 150a, 150b, and 150c in which the MOSFET 100 according to the first embodiment serves as a switching element. By connecting three semiconductor modules 150a, 150b, and 150c in parallel, a three-phase inverter circuit 150 provided with three AC-voltage output terminals U, V, and W is realized. The motor 140 is driven by means of an AC voltage outputted from the inverter circuit 150.

According to the fourth embodiment, by providing the MOSFET 100 which has superior characteristics, the characteristics of the inverter circuit 150 and driver device 700 are improved.

Fifth Embodiment

A vehicle according to a fifth embodiment is a vehicle provided with the semiconductor device according to the first embodiment.

Figure 21:
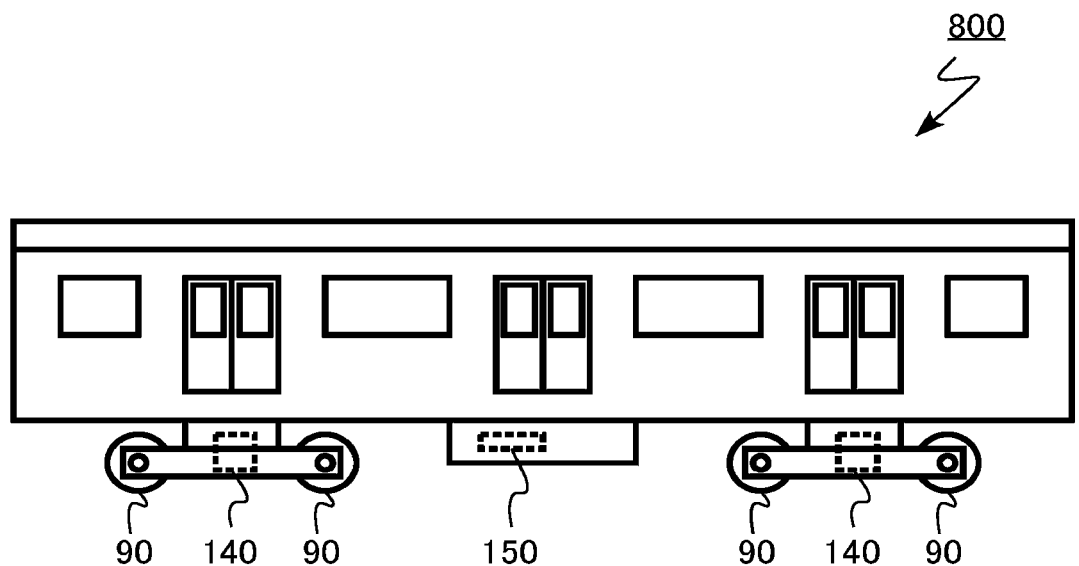
FIG. 21 is a schematic diagram of a vehicle according to a fifth embodiment.

FIG. 21 is a schematic diagram of a vehicle according to the fifth embodiment. A vehicle 800 according to the fifth embodiment is a railroad vehicle. The vehicle 800 is provided with a motor 140 and an inverter circuit 150.

The inverter circuit 150 is configured from three semiconductor modules in which the MOSFET 100 according to the first embodiment serves as a switching element. By connecting three semiconductor modules in parallel, a three-phase inverter circuit 150 provided with three AC-voltage output terminals U, V, and W is realized. The motor 140 is driven by means of an AC voltage outputted from the inverter circuit 150. Wheels 90 of the vehicle 800 are rotated by the motor 140.

According to the fifth embodiment, by providing the MOSFET 100 which has superior characteristics, the characteristics of the vehicle 800 are improved.

Sixth Embodiment

A vehicle according to a sixth embodiment is a vehicle provided with the semiconductor device according to the first embodiment.

Figure 22:
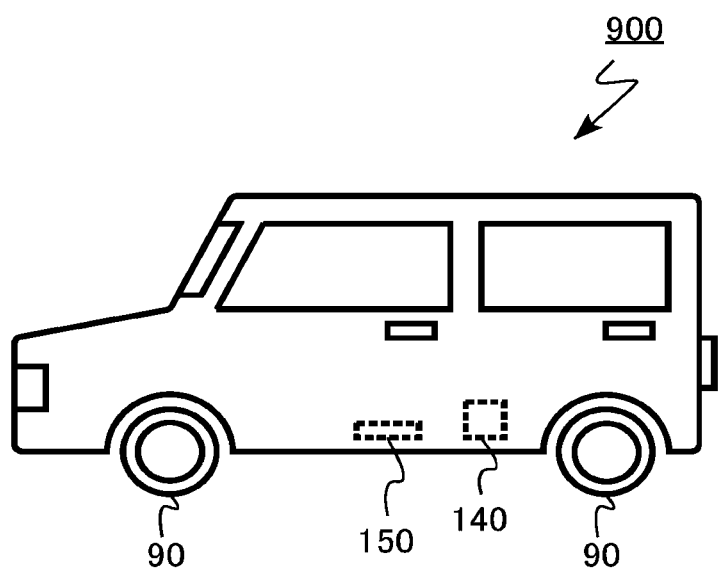
FIG. 22 is a schematic diagram of a vehicle according to a sixth embodiment.

FIG. 22 is a schematic diagram of a vehicle according to the sixth embodiment. A vehicle 900 according to the sixth embodiment is an automobile. The vehicle 900 is provided with a motor 140 and an inverter circuit 150.

The inverter circuit 150 is configured from three semiconductor modules in which the MOSFET 100 according to the first embodiment serves as a switching element. By connecting three semiconductor modules in parallel, a three-phase inverter circuit 150 provided with three AC-voltage output terminals U, V, and W is realized.

The motor 140 is driven by means of an AC voltage outputted from the inverter circuit 150. Wheels 90 of the vehicle 900 are rotated by the motor 140.

According to the sixth embodiment, by providing the MOSFET 100 which has superior characteristics, the characteristics of the vehicle 900 are improved.

Seventh Embodiment

An elevator according to a seventh embodiment is an elevator provided with the semiconductor device according to the first embodiment.

Figure 23:
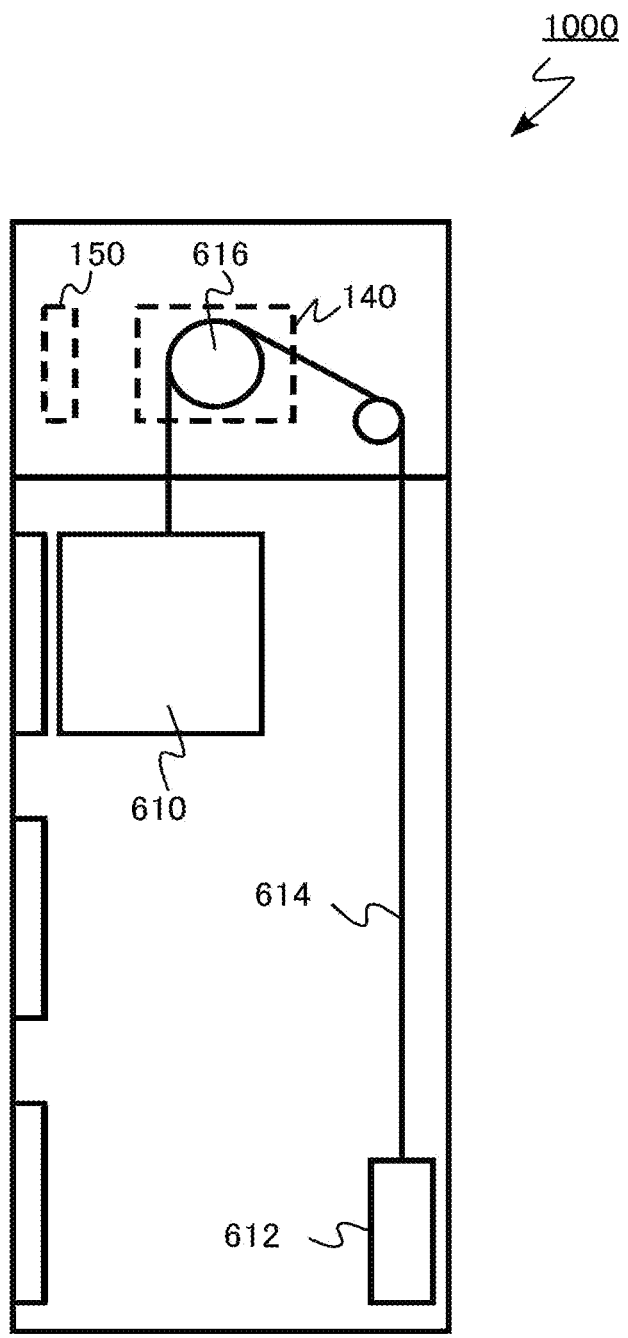
FIG. 23 is a schematic diagram of an elevator according to a seventh embodiment.

FIG. 23 is a schematic diagram of an elevator according to the seventh embodiment. An elevator 1000 according to the seventh embodiment is provided with a car 610, a counterweight 612, a wire rope 614, a hoist 616, a motor 140, and an inverter circuit 150.

The inverter circuit 150 is configured from three semiconductor modules in which the MOSFET 100 according to the first embodiment serves as a switching element. By connecting three semiconductor modules in parallel, a three-phase inverter circuit 150 provided with three AC-voltage output terminals U, V, and W is realized.

The motor 140 is driven by means of an AC voltage outputted from the inverter circuit 150. The hoist 616 is rotated by the motor 140, thus raising and lowering the car 610.

According to the seventh embodiment, by providing the MOSFET 100 which has superior characteristics, the characteristics of the elevator 1000 are improved.

Although a case where 4H-SiC is the silicon-carbide crystal structure has been described by way of example in the first to third embodiments, the present disclosure can also be applied to silicon carbide with another crystal structure such as 6H-SiC or 3C-SiC.

Although a case where the gate insulating layer 28 is provided to the silicon face of the silicon carbide layer or to the face m has been described by way of example in the first to third embodiments, the present disclosure can also be applied to a case where the gate insulating layer 28 is provided to another surface of the silicon carbide, such as the carbon face, face a, or face (0-33-8), for example.

The present disclosure can also be applied to an n-channel insulated gate bipolar transistor (IGBT).

Although a case where the semiconductor device of the present disclosure is applied to a vehicle or an elevator has been described by way of example in the fourth to seventh embodiments, the semiconductor device of the present disclosure can also be applied to a power conditioner or the like of a solar power generation system, for example.

Moreover, although a case where the semiconductor device of the first embodiment is applied has been described by way of example in the fourth to seventh embodiments, the semiconductor device according to the second or third embodiment can also be applied, for example.

While certain embodiments have been described, these embodiments have been presented by way of example only, and are not intended to limit the scope of the inventions. Indeed, the semiconductor device, semiconductor device manufacturing method, inverter circuit, driver device, vehicle, and elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising:
performing first ion implantation implanting aluminum (Al) in the silicon carbide layer with a first projected range and a first dose amount;
performing second ion implantation implanting carbon (C) in the silicon carbide layer with a second projected range and a second dose amount equal to or more than ten times the first dose amount;
performing a first heat treatment at a temperature equal to or more than 1600° C.,
forming a silicon oxide film on the silicon carbide layer; and
forming a gate electrode on the silicon oxide film.

2. The method according to claim 1 further comprising:
performing a second heat treatment in a nitrogen-containing atmosphere before or after the forming the silicon oxide film.

3. The method according to claim 2,
wherein the nitrogen-containing atmosphere is at least one of an atmosphere selected from a group consisting of a first atmosphere containing ammonia gas, a second atmosphere containing nitrogen gas and hydrogen gas, and a third atmosphere containing nitrogen gas and carbon dioxide gas.

4. The method according to claim 1,
wherein the first dose amount is equal to or less than $1\times10^{14}$ cm$^{-2}$.

5. The method according to claim 1,
wherein the second dose amount is equal to or more than $1\times10^{15}$ cm$^{-2}$.

6. The method according to claim 1,
wherein the first projected range and the second projected range are equal to or less than 0.6 μm.

7. The method according to claim 1,
wherein the second projected range is equal to or more than 80% and equal to or less than 120% of the first projected range.

8. The method according to claim 1,
wherein the temperature of the first heat treatment is equal to or more than 1850° C.

9. The method according to claim 1 further comprising:
forming a carbon film on the silicon carbide layer before the performing the first heat treatment, and
removing the carbon film after the performing the first heat treatment.

10. The method according to claim 1,
wherein the silicon oxide film is formed using vapor phase growth method.

11. The method according to claim 1,
wherein the first ion implantation and the second ion implantation are performed in a same region of the silicon carbide layer.

* * * * *